(12) United States Patent  (10) Patent No.: US 8,202,575 B2
Monsma et al.  (45) Date of Patent: Jun. 19, 2012

(54) VAPOR DEPOSITION SYSTEMS AND METHODS

(75) Inventors: Douwe J. Monsma, Cambridge, MA (US); Jill S. Becker, Cambridge, MA (US)

(73) Assignee: Cambridge NanoTech, Inc., Cambridge, MA (US)

( * ) Notice: Subject to any disclaimer, the term of this patent is extended or adjusted under 35 U.S.C. 154(b) by 0 days.

(21) Appl. No.: 11/167,570

(22) Filed: Jun. 27, 2005

(65) Prior Publication Data

US 2006/0021573 A1  Feb. 2, 2006

Related U.S. Application Data

(60) Provisional application No. 60/583,854, filed on Jun. 28, 2004, provisional application No. 60/652,541, filed on Feb. 14, 2005.

(51) Int. Cl.
*C23C 16/44* (2006.01)
*C23C 16/455* (2006.01)

(52) U.S. Cl. .............. 427/255.7; 118/715; 156/345.33

(58) Field of Classification Search .................. 118/715; 156/345.33; 427/255.7
See application file for complete search history.

(56) References Cited

U.S. PATENT DOCUMENTS

| | | | |
|---|---|---|---|
| 2,831,549 A * | 4/1958 | Alpert | 62/55.5 |
| 3,680,163 A * | 8/1972 | De Corso | 373/90 |
| 4,058,430 A * | 11/1977 | Suntola et al. | 427/255.13 |
| 5,183,510 A | 2/1993 | Kimura | |
| 5,280,219 A * | 1/1994 | Ghanbari | 315/111.41 |
| 5,478,610 A * | 12/1995 | Desu et al. | 427/573 |
| 5,651,827 A * | 7/1997 | Aoyama et al. | 118/725 |
| 5,711,811 A | 1/1998 | Suntola et al. | |
| 5,749,974 A | 5/1998 | Habuka et al. | |
| 5,762,341 A | 6/1998 | Wright | |
| 5,855,675 A | 1/1999 | Doering et al. | |
| 5,855,680 A | 1/1999 | Soininen et al. | |
| 5,879,010 A | 3/1999 | Nilkanth et al. | |
| 5,888,579 A * | 3/1999 | Lun | 427/8 |
| 5,916,365 A | 6/1999 | Sherman | |
| 5,928,426 A * | 7/1999 | Aitchison | 118/715 |
| 6,042,652 A | 3/2000 | Hyun et al. | |
| 6,089,543 A | 7/2000 | Freerks | |
| 6,354,241 B1 | 3/2002 | Tanaka et al. | |
| 6,361,049 B1 | 3/2002 | Joco | |
| 6,387,185 B2 | 5/2002 | Doering et al. | |
| 6,402,806 B1 * | 6/2002 | Schmitt et al. | 75/414 |

(Continued)

FOREIGN PATENT DOCUMENTS

EP  0384803  8/1990

(Continued)

OTHER PUBLICATIONS

Braun, A., "Atomic Layer Deposition: Principal and Applications", Semiconductor International (2001).

(Continued)

*Primary Examiner* — Ram Kackar
*Assistant Examiner* — Satish Chandra
(74) *Attorney, Agent, or Firm* — The Marbury Law Group PLLC

(57) ABSTRACT

Vapor deposition systems and methods associated with the same are provided. The systems may be designed to include features that can promote high quality deposition; simplify manufacture, modification and use; as well as, reduce the footprint of the system, amongst other advantages.

18 Claims, 29 Drawing Sheets

U.S. PATENT DOCUMENTS

| | | | |
|---|---|---|---|
| 6,478,872 B1 | 11/2002 | Chae et al. | |
| 6,506,352 B1* | 1/2003 | Lindfors et al. | 423/240 S |
| 6,539,891 B1 | 4/2003 | Lee et al. | |
| 6,579,372 B2 | 6/2003 | Park | |
| 6,579,374 B2 | 6/2003 | Bondestam et al. | |
| 6,585,823 B1* | 7/2003 | Van Wijck | 117/89 |
| 6,630,030 B1 | 10/2003 | Suntola et al. | |
| 6,652,924 B2 | 11/2003 | Sherman | |
| 6,660,126 B2 | 12/2003 | Nguyen et al. | |
| 6,716,284 B2 | 4/2004 | Campbell et al. | |
| 6,734,020 B2 | 5/2004 | Lu et al. | |
| 6,770,145 B2* | 8/2004 | Saito | 118/726 |
| 6,960,537 B2* | 11/2005 | Shero et al. | 438/775 |
| 7,112,544 B2* | 9/2006 | Doan et al. | 438/791 |
| 7,383,841 B2* | 6/2008 | Shinriki et al. | 134/22.1 |
| 2002/0148566 A1* | 10/2002 | Kitano et al. | 156/345.51 |
| 2003/0049372 A1* | 3/2003 | Cook et al. | 427/248.1 |
| 2003/0127050 A1 | 7/2003 | Kashihara | |
| 2003/0136423 A1* | 7/2003 | Akbar et al. | 134/3 |
| 2003/0141016 A1* | 7/2003 | Okase et al. | 156/345.29 |
| 2003/0164326 A1 | 9/2003 | Eberl et al. | |
| 2003/0176047 A1 | 9/2003 | Doan et al. | |
| 2003/0223922 A1 | 12/2003 | Hsu | |
| 2004/0009678 A1 | 1/2004 | Asai et al. | |
| 2004/0011404 A1* | 1/2004 | Ku et al. | 137/341 |
| 2004/0089232 A1* | 5/2004 | Sasaki et al. | 118/620 |
| 2004/0221798 A1* | 11/2004 | Sherman | 117/86 |
| 2005/0000428 A1* | 1/2005 | Shero et al. | 118/715 |
| 2005/0011555 A1 | 1/2005 | Maula et al. | |
| 2005/0115675 A1* | 6/2005 | Tzu et al. | 156/345.33 |
| 2005/0229969 A1* | 10/2005 | Nguyen et al. | 137/240 |
| 2007/0089674 A1* | 4/2007 | Aitchison et al. | 118/715 |
| 2007/0089817 A1* | 4/2007 | Ganguli et al. | 149/19.4 |

FOREIGN PATENT DOCUMENTS

| | | | |
|---|---|---|---|
| JP | 63-299875 A | | 12/1988 |
| JP | 2002525841 A | | 8/2002 |
| JP | 2004-091850 | * | 3/2004 |
| JP | 2004124193 A | | 4/2004 |
| WO | 03062490 A2 | | 7/2003 |

OTHER PUBLICATIONS

European Search Report from European Application No. 09171283.6, mailed Jan. 20, 2010.

International Search Report from PCT/US2005/022896, mailed Mar. 27, 2007.

European Office Action issued in Application No. EP09171253.6, mailed on Mar. 27, 2012.

Office Action, Japanese Patent Office, Application No. 2007-523574, mailing date Apr. 2, 2012, 5pgs.

* cited by examiner

VAPOR DEPOSITION SYSTEMS AND METHODS

RELATED APPLICATIONS

This application claims priority to U.S. Provisional Application No. 60/583,854, filed Jun. 28, 2004, and U.S. Provisional Application No. 60/652,541, filed Feb. 14, 2005, each of which is incorporated herein by reference.

FIELD OF INVENTION

The invention relates generally to vapor deposition systems and methods, and more particularly, to atomic layer deposition systems and methods.

BACKGROUND OF INVENTION

Atomic layer deposition (ALD) is a technique that allows growth of thin films, atomic layer by layer. The technique can be illustrated with, but is not limited to, the deposition of $Al_2O_3$ from water and trimethyl aluminum (TMA) precursors. Recipes for many other materials producing insulators, metals and semiconductors, can be found in the literature. FIG. 1 schematically shows the growth of $Al_2O_3$ from water and (TMA). The general steps include: (a) insert an air hydroxilated substrate into the vacuum chamber, (b,c) The TMA precursor is pulsed and the TMA will react with the OH on the surface. TMA does not react with itself and the formed monolayer, thus passivating. (d) The unreacted TMA molecules are removed by evacuation and/or purging with an inert gas such as nitrogen or argon (e,f) Water is pulsed into the reactor. This will remove the $CH_3$ groups, create Al—O—Al bridges and passivates the surface with Al—OH. $CH_4$ (methane) is formed as a gaseous by-product (g) Unreacted $H_2O$ and $CH_4$ molecules are removed by evacuation and/or purging with nitrogen. (a-g) is called a cycle and each cycle produces about 1.1 Angstrom of $Al_2O_3$. Thus, 100 cycles produces 110 Angstrom of $Al_2O_3$.

Design of ALD systems has followed different approaches, some of which are based on deposition systems used for other deposition techniques (e.g., chemical vapor deposition).

One approach is the laminar flow tube furnace, as shown in FIG. 3. In this case, a substrate 28 is inserted into a tube 24 through an access port 36. The substrate is heated using a tube furnace heater 26 and the reaction chamber inside the tube 24 is evacuated using a pump 34. The pressure is measured with a vacuum gauge 30. A continuous inert gas flow (carrier gas) is supplied from a cylinder 10 and injected into the precursor lines using inert gas lines 12. The precursors are heated using an oven 14. Precursor vapor is pulsed from precursor containers 16 and 20, using electronically controlled valves 18 and 22. These types of reactors are often found in research environments and are generally more suitable for small substrates, since large substrates increase the tube furnace size dramatically, both in diameter and length, in order to maintain sufficient temperature uniformity. The design is based on CVD systems, where very high temperatures are typically used and low temperature O-ring access is displaced from the tube furnace heater.

A second ALD system design also derived from the CVD technology is shown in FIG. 4. In this case, a shower head 42 is used to supply the precursors in an effort to uniformly disperse the chemicals over the surface. In such designs, the substrate heater is generally found inside the vacuum space. Although the showerhead vapor injection design may be effective in CVD systems, where gas or vapor is injected that only reacts at the high substrate temperature site, and where uniform gas distribution is essential for uniform film thickness, such a design can lead to clogging in ALD systems where precursor residues can react with each other at showerhead temperature. Moreover, in contrast to certain CVD processes, ALD does not typically require very uniform dispersion of the precursor do to the self-limiting nature of the process. In addition, in order to prevent condensation of precursors, the showerhead and other parts of the system are generally heated to a temperature range of 100-200° C., which can be complicated for complex geometries such as showerheads. Lastly, because of the large surface area and small cavities, the evacuation and purging of precursor in the deposition cycles can be difficult.

For production ALD systems, usually deposition stations are combined in a cluster tool arrangement. Wafers racks are inserted into a load lock, transferred in a transfer chamber through a slit valve arrangement. A robotic arm moves the substrates to the deposition station, where it is stacked vertically with other substrates using a vertical translation robot. After deposition the substrates are removed through unloadlock.

A single unit system is generally characterized by a horizontal precursor gas flow, and horizontal access port (slit valve) in the front. The height of the single unit defines the internal reactor volume and precursor flow speed, and is optimized for fast flow and gas utilization, and for one specific substrate type, thickness and diameter (usually silicon wafers).

Because of the complex nature of the design to achieve large throughput for one particular type of substrate, modification, upgrading, cleaning and repair can be very time consuming, and the systems do not lend themselves for research and development purposes.

Most ALD systems thus far have focused deposition on planar substrates such as silicon wafers, or, in the case of tube furnaces, wafer pieces, even though the ALD technique can be used to coat complex 3D structures, such as capacitor trenches, nanotubes, plastics, inverse opals, catalytic beds, photonic crystals, engine components, tools, optical parts etc. Since the ALD technology is highly scalable to large dimension samples, research of this technique in fields other than the semiconductor industry is desired and a tool that is easily adapted to a variety of samples geometries can be advantageous.

SUMMARY OF INVENTION

Vapor deposition systems and methods are provided, as well as components used in such systems and methods.

In one aspect, the invention provides an atomic layer deposition system. The system includes a reaction chamber designed to enclose a substrate. The reaction chamber has a top surface, a bottom surface and a sidewall between the top and bottom surfaces. A first precursor supply is connected to a precursor port formed in the bottom surface. A second precursor supply is connected to a precursor port formed in the bottom surface. An outlet port is formed in the bottom surface.

In another aspect, the invention provides an atomic layer deposition system. The system includes a reaction chamber designed to enclose a substrate. The reaction chamber has a top surface, a bottom surface and a sidewall between the top and bottom surfaces. A first precursor supply and a second precursor supply are connected to a precursor port formed in the bottom surface.

In another aspect, the invention provides an atomic layer deposition process. The process includes positioning a substrate in a reaction chamber having a top surface, a bottom surface and a sidewall between the top and bottom surfaces. The process further includes introducing a first precursor into the reaction chamber through a precursor port formed in the bottom surface and removing gaseous species through an outlet port formed in the bottom surface. The process further includes introducing a second precursor in to the reaction chamber through a precursor port formed in the bottom surface and removing gaseous species through the outlet port formed in the bottom surface.

In another aspect, the invention provides a trap designed for use in a vapor deposition system to trap gaseous species. A majority of the surface area of the trap is substantially parallel to flow of gaseous species through the trap.

Other aspects, embodiments and features of the invention will become apparent from the following detailed description of the invention when considered in conjunction with the accompanying drawings. The accompanying figures are schematic and are not intended to be drawn to scale. In the figures, each identical, or substantially similar component that is illustrated in various figures may be represented by a single numeral or notation (though not always). For purposes of clarity, not every component is labeled in every figure. Nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

Figure 1:
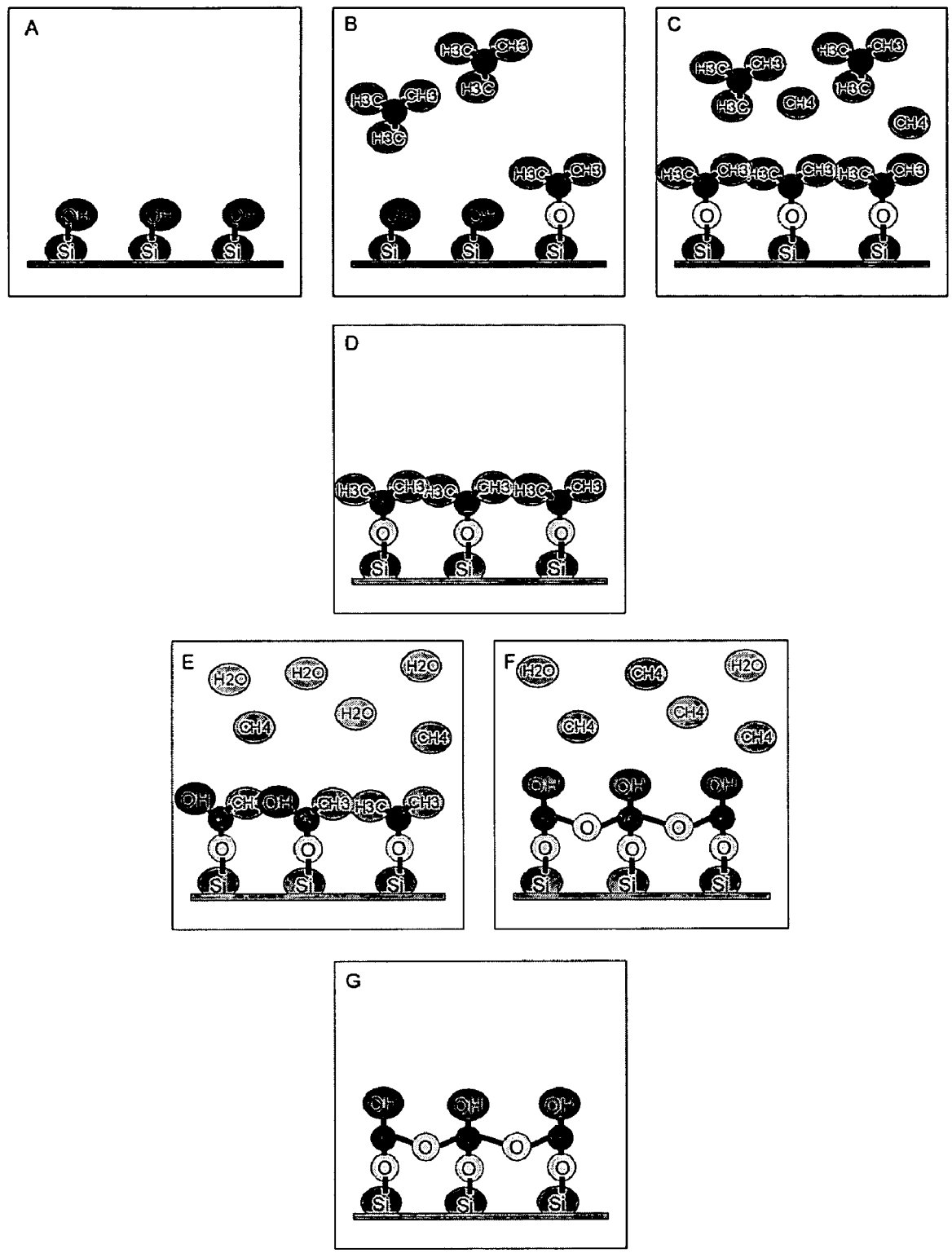
FIG. 1 shows an atomic layer deposition process.

ENUMERATION OF FEATURES IN THE FIGURES 50, 52 Precursor valve pulse widths
54, 56, 58 Pumping down
55 Pressure after first precursor pulse
57 Pressure after second precursor pulse
60, 62, 64 Inert gas flow (purge)
61 Inert gas flow+first precursor pulse
63 Inert gas flow+second precursor pulse
66, 68, 70 Stop valve open (pumping)
70 After first precursor valve pulse
69 After second precursor valve pulse
10 Inert gas supply
12 Inert gas supply lines 14 Precursor heating oven
16 First precursor
18 First precursor pulse valve
20 Second precursor
22 Second precursor pulse valve
24 Reactor tube
26 Tube furnace heaters
28 Substrate
30 Vacuum gauge
32 Pumping line
34 Vacuum pump
36 Substrate access
38 Substrate heater
40 Vacuum chamber
42 Shower head precursor vapor supply
100 Reactor assembly
102 Stainless steel reactor base body
105 Aluminum reactor lid
106 Handle
108 Handle rubber
110 Hinges
112 Wafer space
114 O-ring groove
116 O-ring
118 First precursor port
120 Second precursor port
122 Output (pumping line) port
124 Substrate heater
125 Nut holding substrate heater
126 Outer tubular heater
128 Dual function threaded bolts: fixing tubular heater and reactor to cabinet
130 RTD center temperature hole
132 RTD center
134 RTD wall temperature hole
136 RTD wall
138 Thin reactor body profile
140 Reactor space
142 Expanded reactor lid
144 Expansion area
146 Reaction chamber protruding lid
148 Protrusion
202 First precursor cylinder
204 Manual valve
206 Pulse valve for first precursor
208 VCR union for first precursor line
210 Second precursor cylinder
212 Pulse valve for second precursor
214 VCR union for second precursor line
302 Vacuum pump
304 Bellows
306 Solenoid stop valve
308 KF cross
310 Solenoid vent valve
312 Vacuum gauge
402 Cabinet access door
404 Cabinet top
406 Left side panel
408 Right side panel
412 Bottom
414 Frame
416 Hole for first precursor ports
417 Hole for second precursor port
418 Hole for pumping port
420 Four holes for fixing bolts
422 Outer RTD mounted to cabinet top
423 Inner RTD mounted to cabinet top
424 Holes for outer (tubular) heater
426 Electrical wire feed through hole for substrate heater
502 Three port pulse valve for first precursor
504 Precursor input port
506 Precursor+inert gas output port
508 Inert gas input port
512 Three port pulse valve for second precursor
514 Precursor input port
516 Precursor+inert gas output port
518 Inert gas input port
520 NW tee
522 Aluminum heater half block left, pumping line assembly
524 Aluminum heater half block right, pumping line assembly
526 Heater cartridge hole
528 Screw holes in heater halves for mounting the halves together, forming the tee or cross heater block
530 Pumping line assembly heat reflection plate, right side
532 Pumping line assembly heat reflection plate, left side
540 Precursor valves heater half block left.
542 Precursor valves heater half block right.
544. Precursor valves heater reflection plate left.
546. Precursor valves heater reflection plate right.
550. Pumping line heating jacket.
600. Precursor line welded manifold.
602. Precursor line manifold heating block, right half.
604. Precursor line manifold heating block, left half.
606. Precursor line manifold heating block reflector plate, right.
608. Precursor line manifold heating block reflector plate, left.
620. Single precursor port
622. Bottom surface of the reactor chamber according to an embodiment of the present 624. Outlet port of reactor chamber
625a, 625b. Manifold inlets
626. Manifold
628. Manifold outlet
630. Trap

DETAILED DESCRIPTION OF INVENTION

The invention provides atomic layer vapor deposition systems and methods associated with the same. The systems include a reaction chamber that enclose a substrate (or more than one substrate). Precursor (e.g., reactive species) supplies are connected to the reaction chamber through a port (or ports) to introduce suitable precursors into the chamber. In some cases, multiple precursor supplies are connected to a single precursor port; while, in other cases, each precursor supply may be connected to separate, respective ports. An outlet port may also be provided in the reaction chamber, for example, to remove gaseous species (e.g., unreacted precursor, reaction products, inert gas) at certain points during the process. The system includes an arrangement of heaters which provide suitable temperature conditions to promote a reaction between the precursors to deposit a material layer on the substrate. As described further below, the systems of the invention may be designed to include features that can promote high quality deposition; simplify manufacture, modification and use; as well as, reduce the footprint of the system, amongst other advantages.

In certain embodiments, it is preferable for the precursor port (or ports) to be formed in a bottom surface of the reaction chamber (e.g., between an outer tubular heater and substrate sections). In some cases, it is preferable for all of the precursor ports (whether there is a single port or multiple ports) to be formed in the bottom surface. In these cases, the top surface (e.g., lid) and sidewall of the reaction chamber may be free of precursor ports. When the precursor port(s) are formed in the bottom surface, it may be preferable for the port(s) to lead directly into the reaction chamber as shown in the illustrative embodiments.

As described further below and illustrated in certain figures, positioning the precursor port(s) in the bottom surface of the reaction chamber can reduce the footprint of the system which can save valuable cleanroom space. The footprint can be reduced, in part, by facilitating the attachment of the ports to the precursor supplies. For example, the precursor supplies may be positioned in a cabinet below the reaction chamber (e.g., See FIG. 5) and connected to ports using supply lines that can having simple designs. In some cases, the supply lines may extend vertically in a substantially straight line from the precursor supplies directly to the respective precursor ports (e.g., in embodiments including multiple ports); while, in other cases, the supply lines may extend vertically in a substantially straight line to a manifold (e.g., in embodiments including a single port) which may be further connected to a precursor port using another straight line supply line. The straight vertical geometry of the precursor lines allow them to simply dangle from the reaction chamber where no additional support is required, and in direct proximity to the precursor supplies. Moreover, the vertical attachment and/or orientation of the precursor lines has manufacturing and assembly advantages. For example, this can facilitate connecting precursor line(s) to the port(s), as well as attachment of heater jackets to precursor lines to keep the lines at a desired elevated temperature (e.g., 135° C.) to prevent condensation of precursor.

Figure 11A:
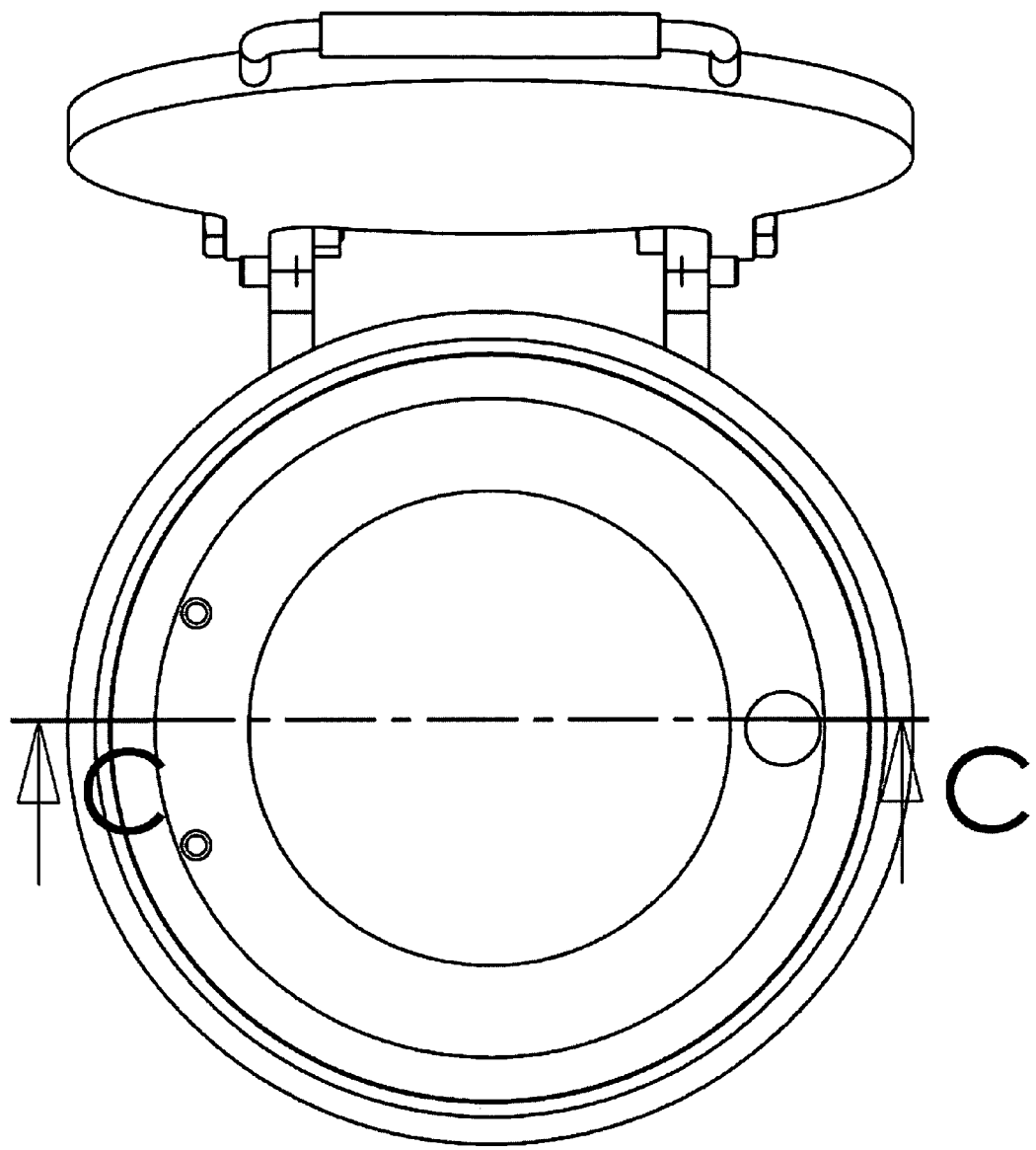
FIG. 11A is a top view of a reactor according to an embodiment of the present invention, with cross section line indication ("C").

In certain embodiments, the outlet port of the system is formed in the bottom surface of the reaction chamber. It may be preferred in certain embodiments for both the precursor port(s) and the outlet port to be formed in the bottom surface. In these embodiments, the top surface (e.g., lid) and sidewall of the reaction chamber may be free of all types of ports. In some cases, the outlet port may be positioned relative to the precursor port(s) such that the substrate is between the precursor port(s) and the outlet port. For example, the outlet port may be on a substantially opposite side of the substrate as the precursor port(s) (e.g., See FIGS. 11A and 25).

Positioning the outlet port in the bottom surface of the reaction chamber can reduce the footprint of the system for similar reasons as described above in connection with the precursor port(s). For example, the footprint can be reduced by facilitating attachment of the port to a vacuum pump. For example, the vacuum pump may be positioned in a cabinet below the reaction chamber (e.g., See FIG. 5) and connected to the port using a pumping line that has a simple design. In some cases, the pumping line may extend vertically in a substantially straight line at least part of the distance between the vacuum and the port. The straight vertical geometry of the line can allow it to simply dangle from the reaction chamber where no additional support is required, and in direct proximity to the vacuum. Also, the vertical attachment and orientation of the pumping lines can facilitate manufacturing, assembly and cleaning.

Positioning the precursor and outlet ports at the bottom surface of the reaction chamber can allow the height of the reactor base to be small, while providing a relatively large outlet port opening. This combination of low reactor height and large outlet port decreases heat-up and pump down time and improves throughput.

The vapor deposition systems of the invention may be designed to promote beneficial heating conditions. For example, as described further below, the system may include separate heaters which heat the substrate area and other areas of the chamber (e.g., o-ring, lid, sidewalls) separately. Such a design enables the temperature of the substrate to be maintained relatively high (e.g., about 600° C.), while maintaining the other areas relatively low (e.g., about 150° C.). The substrate area may be heated, for example, by an external heater (e.g., a disc heater) that is positioned outside of the reaction chamber (e.g., beneath the reaction chamber) and heats the substrate area by thermal conductance. The other areas of the chamber may also be heated by a tubular heater external to the reaction chamber. Thus, in some embodiments, no heaters may be enclosed by the reaction chamber. Differential temperature between the substrate area and other areas of the reaction chamber may further be enhanced by spacing the reactor base above a supporting surface (e.g., the top surface of a cabinet), using the air space in-between as an insulating medium that prevents thermal conductance from the substrate heater to the outside O-ring area.

In some embodiments, the lid can be made of a high thermal conductance material such as aluminum or copper, or when transparency is desired, sapphire. The outer tubular heater attached to the reactor base can heat the lid to a sufficient temperature by thermal conductance once the vacuum pulls the lid in mechanical contact with the reactor base. The high thermal conductance of the lid promotes temperature uniformity throughout the lid and may eliminate the need for a separate lid heater. Thus, in certain embodiments, the lid is free of a heater which can simplify design and maintenance, as well as allowing the lid to be replaced easily (e.g., in different processes which to allow for different substrate geometries or to induce certain flow patterns).

Figure 5:
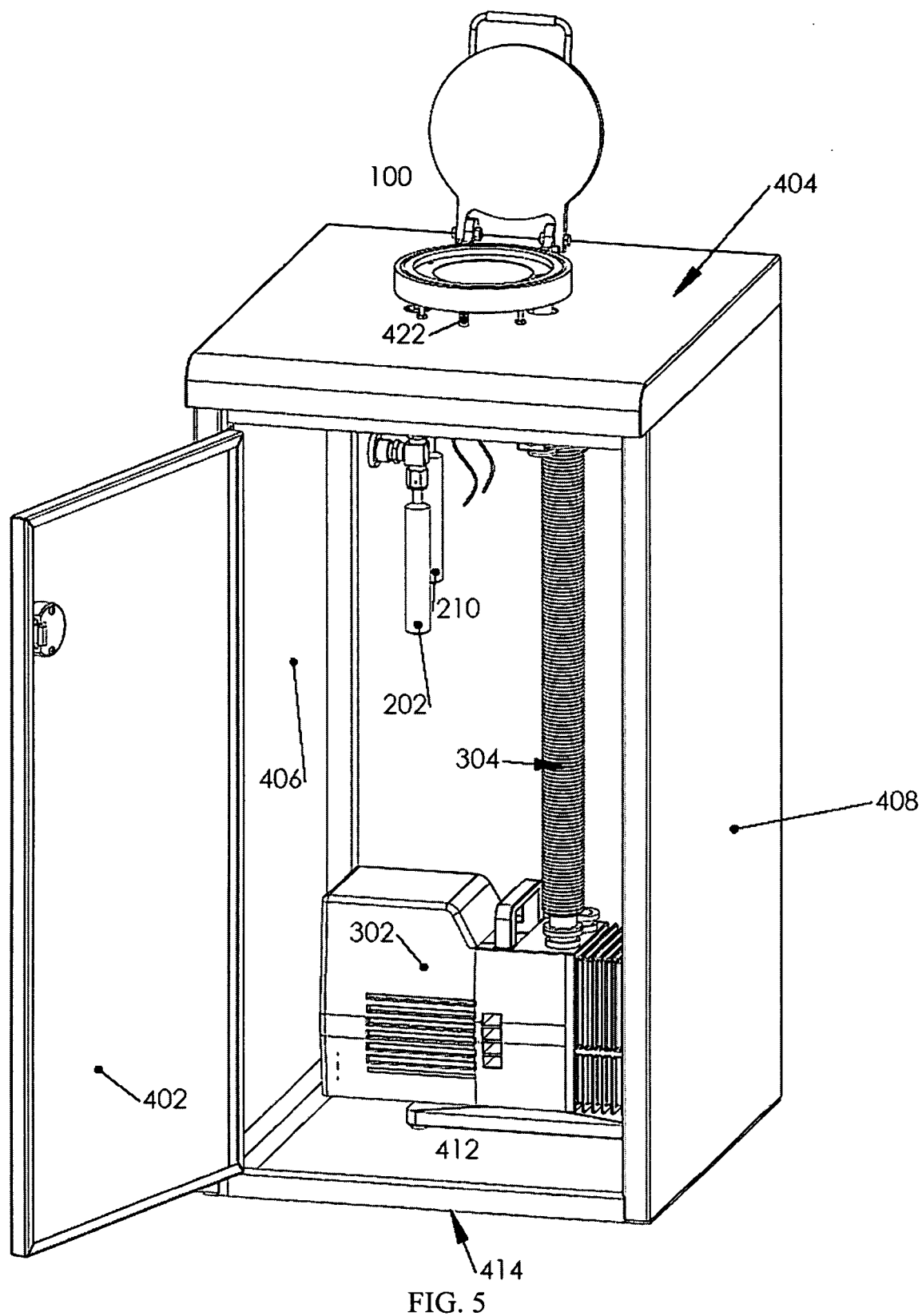
FIG. 5 is an isometric view of an ALD cabinet and reactor assembly combination according to an embodiment of the present invention.

FIG. 5 illustrates a vapor deposition system according to one embodiment of the invention. In the illustrative embodiment, the vapor deposition system is an atomic layer deposition (ALD) system. However, it should be understood that certain embodiments of the invention are not limited to ALD and are applicable to others types of vapor deposition systems including chemical vapor deposition (CVD) systems.

In this illustrative embodiment, a cabinet includes a door 402, side panels 406 and 408, and a top 404. The cabinet provides space for various components of the system including: precursor line and pumping line components (described further below), control electronics, vacuum pump 302, precursor cylinders 202 and 210, and their heater jackets. A bottom 412 of the cabinet may be open to allow the pump to be positioned on the floor. This advantageously limits transfer of vibration from pump 302 to cabinet and reactor. In this embodiment, temperature sensors (e.g., resistor temperature devices (RTDs)) 422 and 423 are mounted on the top 404 of the cabinet. As shown, the pumping and precursor line are vertically suspended from the reactor assembly 100. The control electronics may be located as an enclosure inside the cabinet and are connected to a personal computer using a universal serial bus (USB) interface. Heater jackets may surround different components of the system that are described further below including precursor cylinders 202, 204, precursor solenoid valves, output line cross and bellows. Temperature sensors may be provided on these components (e.g., valves and vacuum gauge) to ensure that the components stay sufficiently warm enough to prevent condensation of vapors, but still within the specified temperature range.

Figure 6:
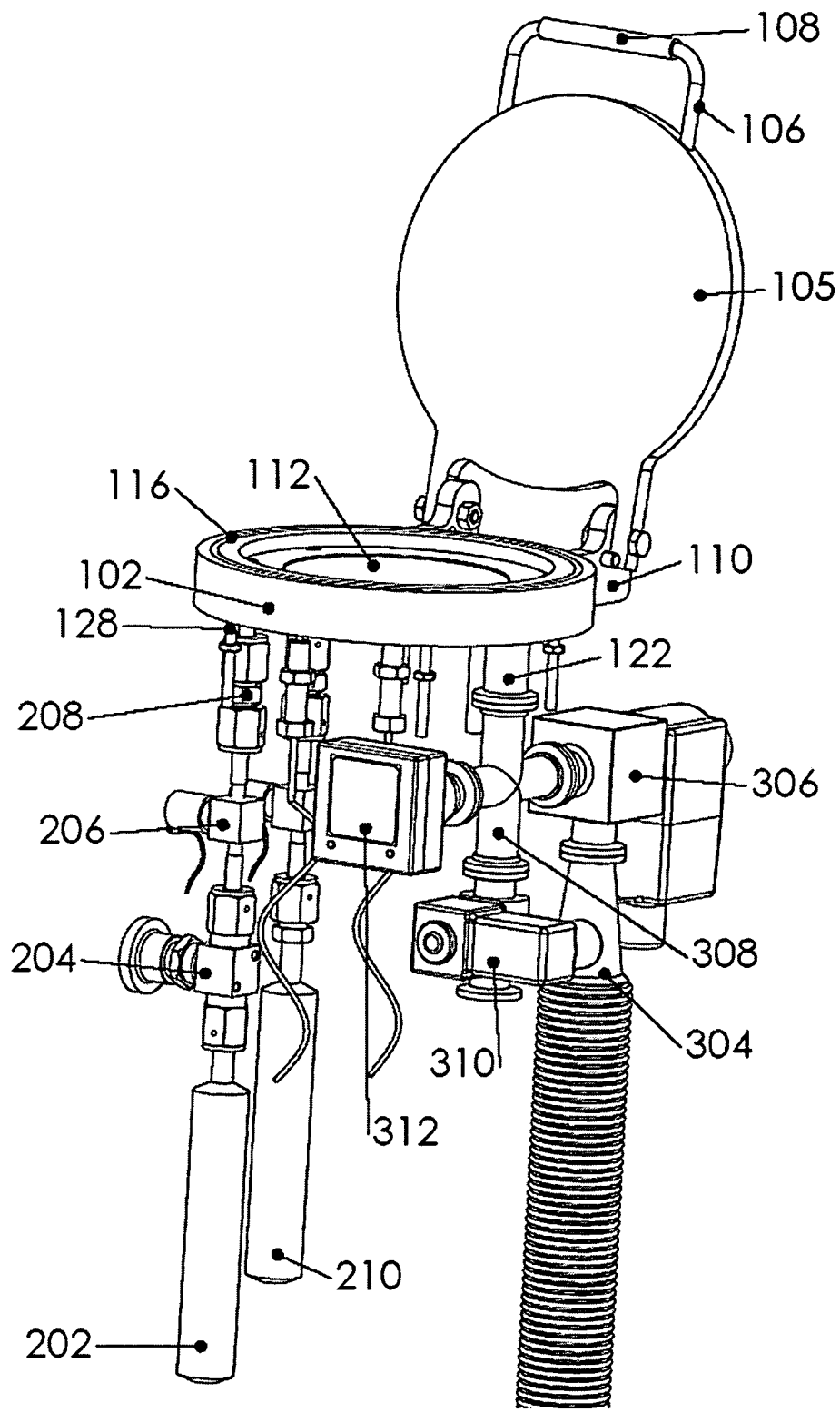
FIG. 6 is an isometric view of a reactor assembly according to an embodiment of the present invention.
Figure 7A:
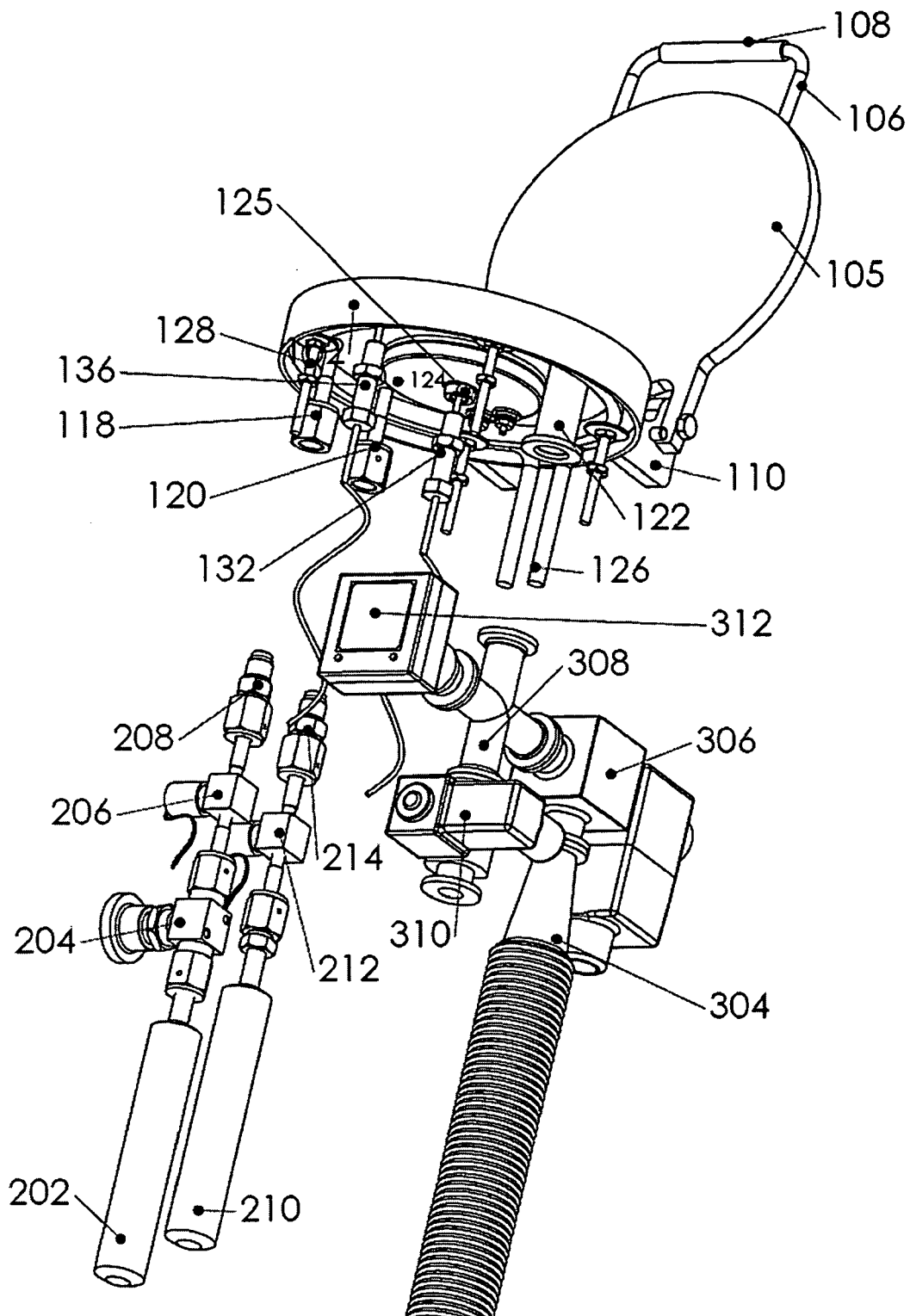
FIG. 7A is an exploded isometric view of a reactor assembly according to an embodiment of the present invention.

FIGS. 6 and 7 illustrate different views of components of a deposition system (without the cabinet and pump) according to one embodiment of the invention. FIG. 6 shows a view in which the precursor lines and pumping line are connected, and FIG. 7A shows an exploded view. A reactor base 102 of the system has a substrate area 112, an O-ring groove 114, an O-ring 116, hinges 110, a lid 105 and handle 106. In certain embodiments, it is preferred that the reactor base is formed of a low thermal conductivity material, such as stainless steel. It may also be preferred that the handle be formed of a thin walled low thermal conductivity material (e.g., stainless steel) to allow opening of the reactor, even while the reactor top is at an elevated temperature (e.g., 100-200° C.). In some cases, the handle is surrounded, in part, by an insulating portion (e.g., formed of cold touch rubber) 108 to provide thermal insulation from the elevated temperatures.

Figure 23:
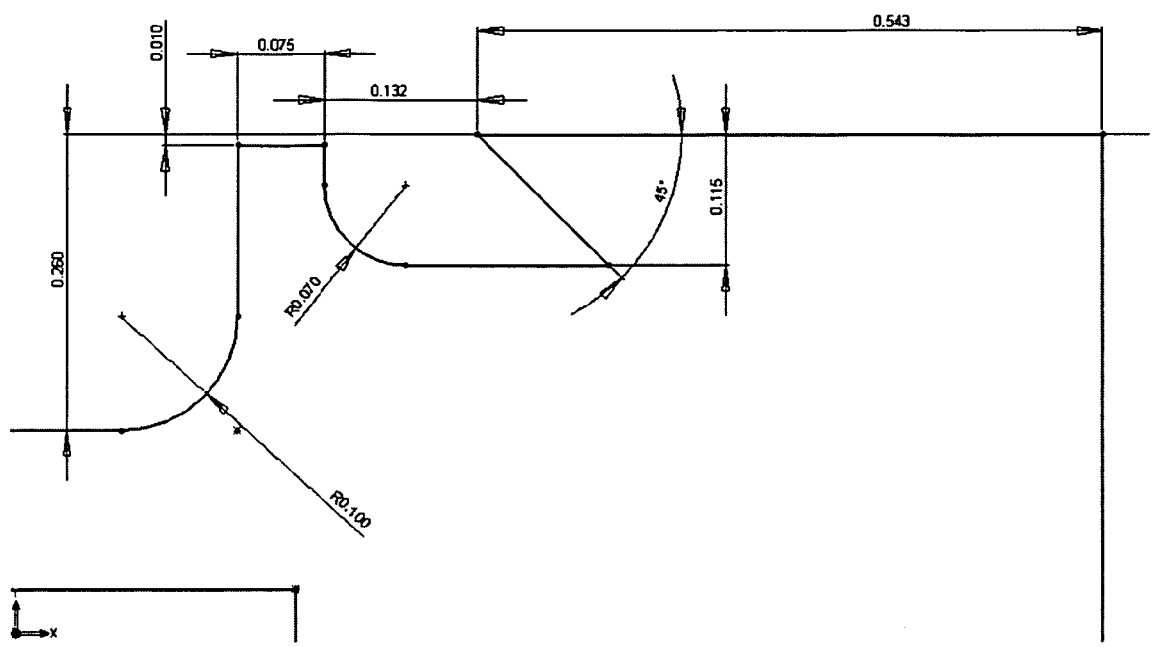
FIG. 23 shows an O-ring groove design according to an embodiment of the invention.

O-ring groove 114 is shown in more detail in FIG. 23. In certain conventional deposition systems, half-dovetail groove designs can be used to lock an O-ring in place and provide sufficient space for expansion. A half-dovetail creates a cavity in the corner below the O-ring groove, which acts as a virtual leak. Especially in atomic layer deposition, where it is preferable to remove one precursor completely, before letting in the second precursor, it may be important to limit the presence of such cavities. In certain embodiments, the system includes a modified half-dovetail groove design. One modification used in certain embodiments of the invention is that the vacuum side of the groove bottom is rounded, with a radius comparable or slightly less than that of the O-ring. A radius of 0.070 inch in shown in FIG. 23, which can be suitable, for example, with an ⅛ inch cross sectional diameter O-ring. In this design, the only cavity is on the atmospheric (right) side of the bottom of the O-ring, in the dovetail, but since this is on the atmospheric side, it does not create a virtual leak. A second modification of a standard half-dovetail groove, used in certain embodiments of the invention, is that the vacuum side (left side in the drawing) has an O-ring supporting edge that is slightly lower (e.g., 0.010 inch) than the top of the reactor body. This facilitates quick evacuation of gas.

All dimensions in FIG. 23 are in inches, and suitable for a ⅛" diameter O-ring. However, it should be understood that other dimensions are also possible in different systems. Moreover, other groove designs may also be suitable in certain embodiments of the invention.

The illustrative embodiment of FIGS. 6 and 7 includes a first precursor port 118 and a second precursor port 120. In this embodiment, the first precursor supply (e.g., a precursor cylinder) 202 is connected to the first precursor port and the second precursor supply 210 (e.g., a precursor cylinder) is connected to the second precursor port. However, it should be understood that other systems of the invention may include a single precursor port to which both the first precursor supply and the second precursor supply are connected (e.g., using a manifold having two inlets and a single outlet; See FIGS. 24 and 25). Also, it should be understood that any number of precursor supplies may be used (e.g., 3, 4, 5, etc.) with each precursor supply being connectable to respective ports in the reaction chamber, or all precursor supplies connected to a single port (e.g., using a manifold having multiple inlets and a single outlet).

As shown in FIGS. 6 and 7, precursor supply 202 is filled with a first precursor. Manual valve 204 is provided, in certain cases, to allow shipping from the chemical manufacturer of the precursor. Cylinder 202 can be removed after closing manual valve 204 and replaced with another precursor cylinder if desired (e.g., when the precursor has been exhausted). Connections at the precursor side are VCR in this embodiment, attached to the manual valve 204 is a high speed solenoid pulse valve 206, that allows injection of precursor down to the millisecond range.

The second precursor supply is configured similarly to the first precursor supply, except that non-aggressive precursors such as water can be filled by the user and may not include a manual valve 204. For example, cylinder 210 could be filled with de-ionized water on site, and attached to solenoid valve 212 without a manual valve. A chemical, such as trimethyl aluminum (TMA), generally needs to be filled in a glove box and needs to be closed with a manual valve, to avoid exposure to air. Subsequently it can be connected to solenoid valve 206 and manual valve 204 can be opened when the system is evacuated or filled with an inert gas such as nitrogen.

Figure 7B:
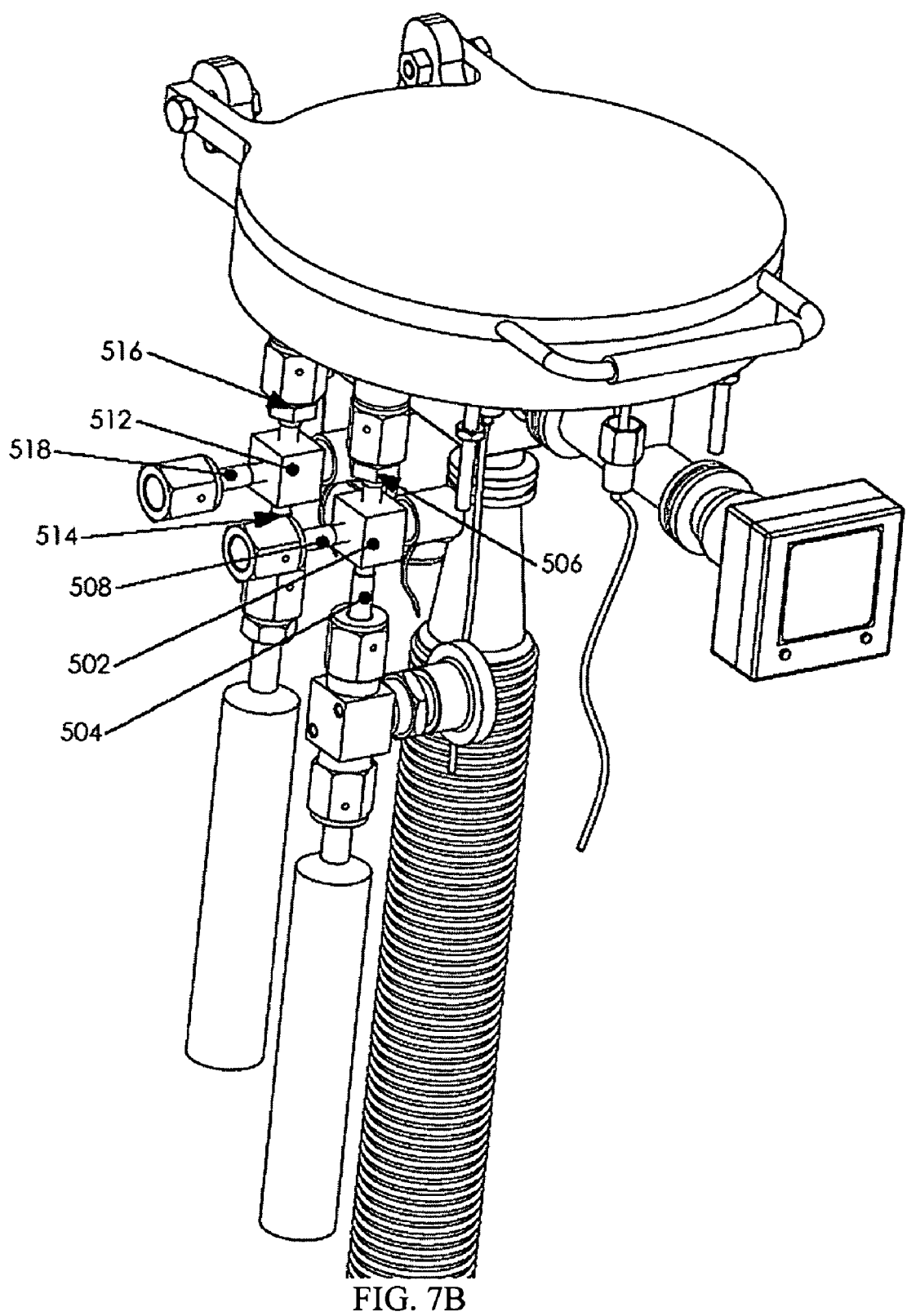
FIG. 7B is an isometric view of a reactor assembly showing gas inline tees according to an embodiment of the present invention.

Typical ALD processes use an inert carrier gas (e.g., nitrogen, argon, xenon, amongst others). The carrier gas may be introduced through one (or more, if present) of the precursor ports. In certain embodiments, an inert carrier gas supply is connected to a precursor supply line. At certain points during processing, the inert gas may be mixed with the precursor so that an inert gas-precursor mix is introduced into the chamber; while, at other points during processing, the inert gas may be introduced into the chamber alone (e.g., without the precursor). As shown in FIG. 7B, the inert gas supply may be connected to the precursor supply line(s) using a suitable valve assembly. As shown, a line from the inert carrier gas supply can be hooked up to an inlet of three-port pulse valves 502 and 512 which are also connected to the precursor supplies. This configuration enables the system to be operated in ALD mode 2 which is discussed further below. Operation of the valves can be controlled, as described further below, to control introduction of the inert gas and/or precursor into the chamber.

These inert carrier gas supply lines may include other valves and/or mass flow controllers. For example, a mass flow controller may be used for the inert gas supply. The output of the mass flow controller splits up into however many pulse valves are mounted, so that each valve receives the same amount of flow. Three-port pulse valve 502 has a bottom input port 504 connected to the precursor supply so that the valve can pulse the precursor. Internally, the flow path from the inert gas input line 508 of pulse valve output 506 may always remain open in certain ALD processes. In such processes, the valve is normally closed, meaning that inlet 504 is closed when the valve is not actuated, while at the same time, path 508 to 506 is always open. When pulsing the valve, line 504 is opened to both line 508 and 506, but because the inert gas is coming into 508 from the mass flow controller, the inert gas-precursor mix is introduced into the reaction chamber. This "inert gas assist" process prevents one precursor from one pulse valve from entering a second pulse valve, preventing or minimizing deposition in all valves. As shown in FIG. 7B, with two input ports on the reactor, two precursor pulse valves can be directly mounted to the VCR connection which are welded to the reactor. The vent valve 310 in FIG. 7A can be removed and cross 308 replaced by a tee, because the system can be vented after deposition using the nitrogen supply gas.

Figure 8:
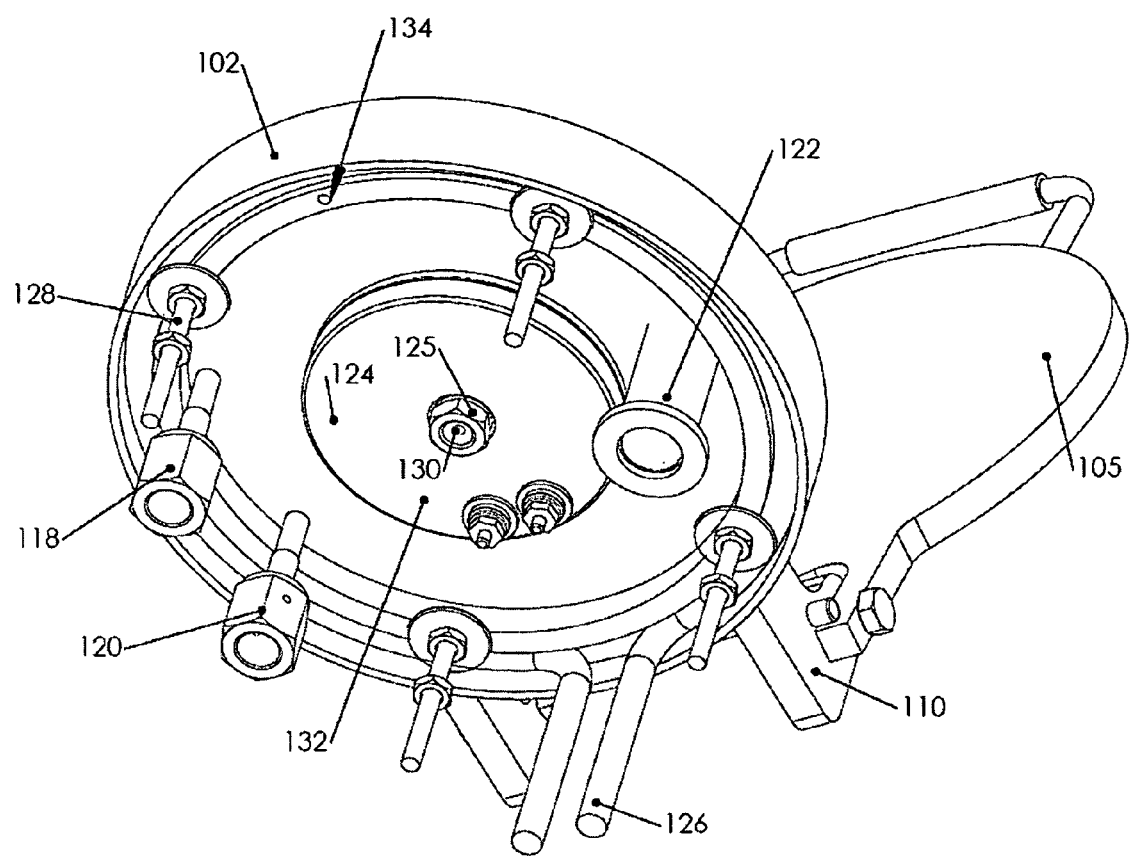
FIG. 8 is an isometric bottom view of a reactor according to an embodiment of the present invention.
Figure 15:
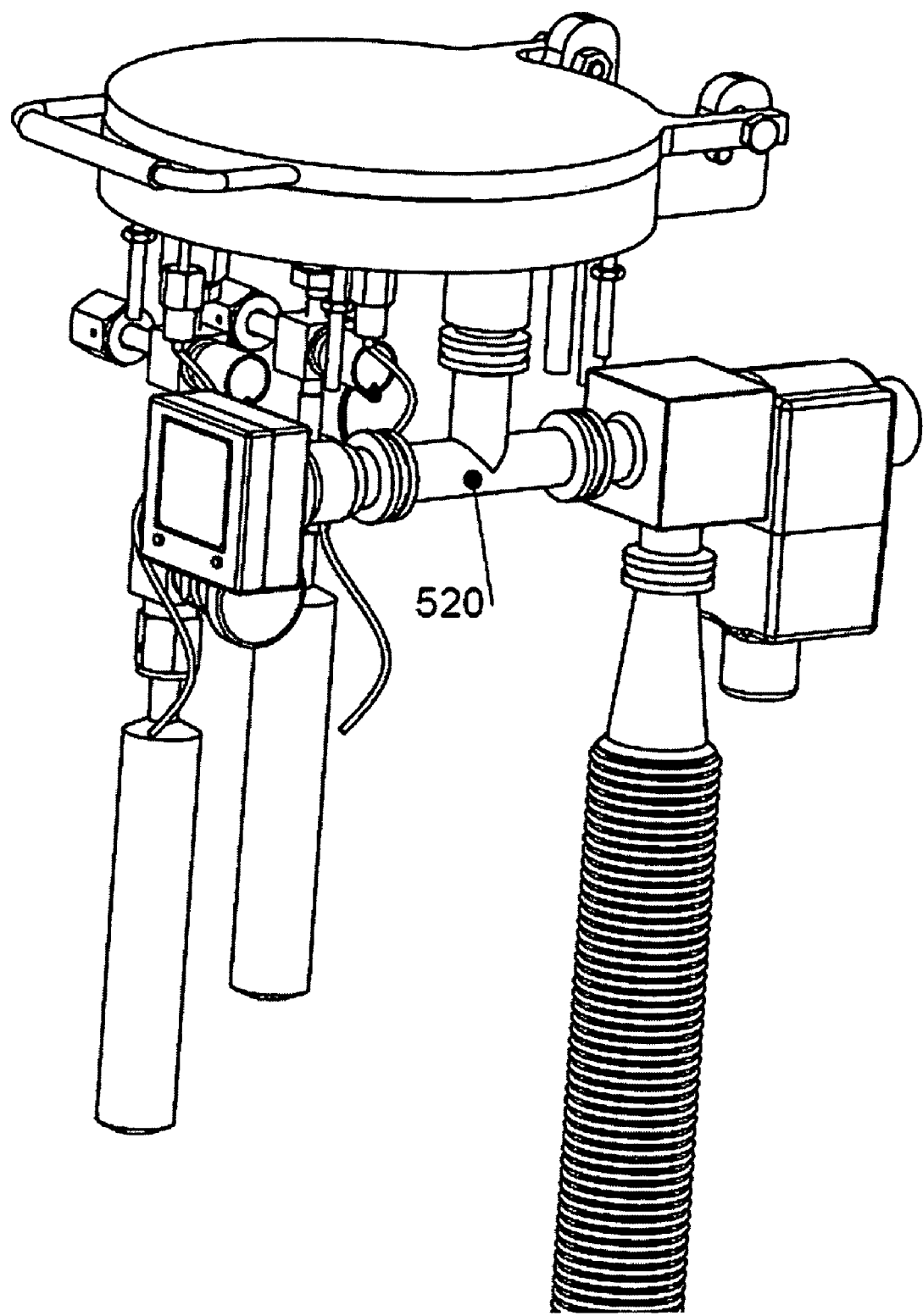
FIG. 15 shows the attachment of an NW tee to reactor, gauge and stop valve according to an embodiment of the invention.

As shown in FIG. 8, a KF fitting 122 is welded to the reactor base 102 to define, in part, the pumping port that is formed in the bottom surface of the reactor. A cross 308, a vent valve 310, vacuum gauge 312 and stop valve 306 can be connected to the fitting. Access to the pump located vertically below the reactor is a pumping line bellows 304. When using the inert gas assist operation, and three-port valves 504 and 502, venting of the system can be done using the inert gas, and no separate vent valve is necessary. This configuration is shown in FIG. 15. In this embodiment, three-port valve 502 is connected to the outlet port, the 312 vacuum gauge and the stop valve 306.

Figure 16:
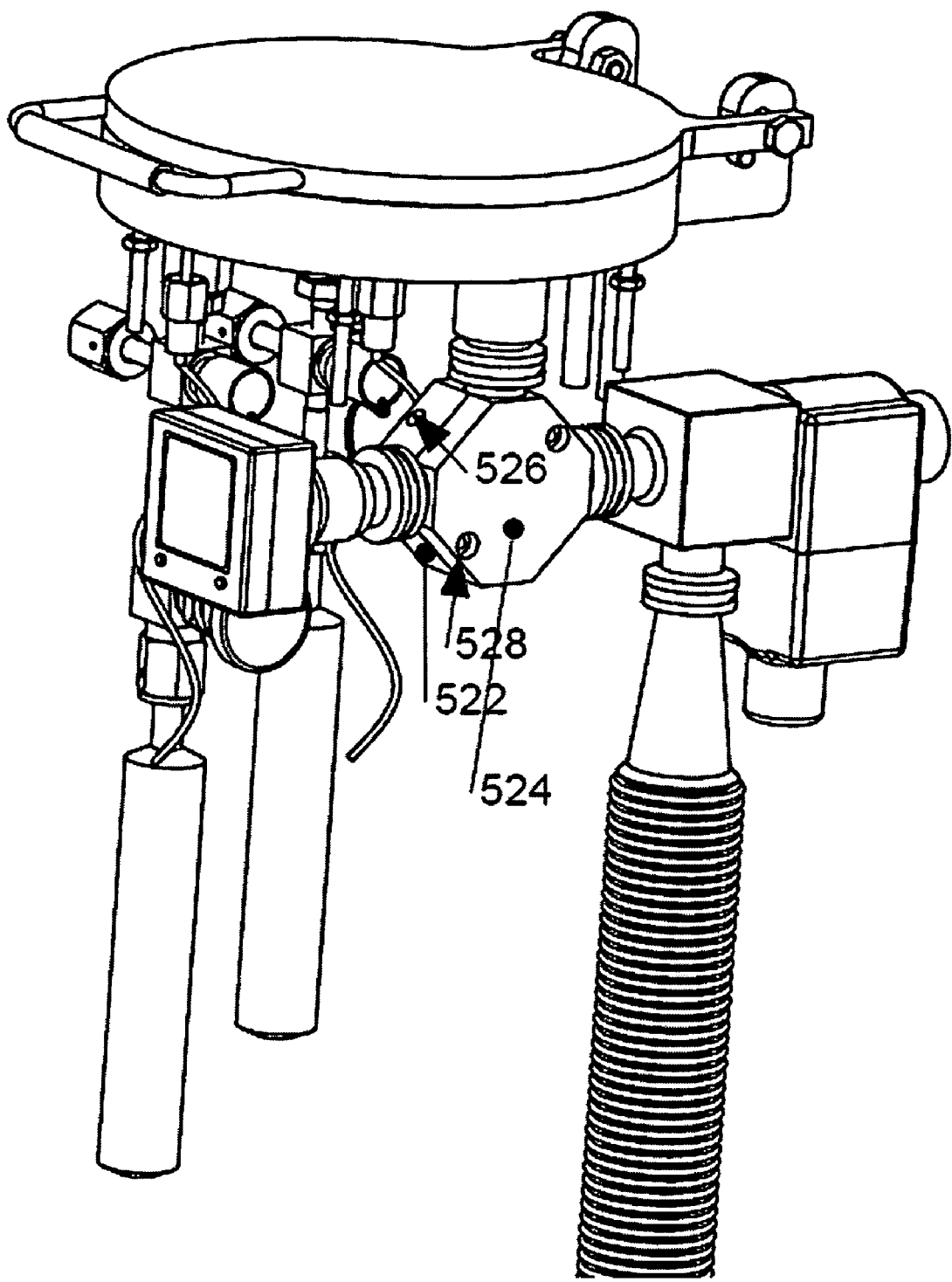
FIG. 16 shows the attachment of a heater block to a tee according to an embodiment of the invention.

Valve 502 may be heated using a heater. As shown in FIG. 16, the heater may comprise a heater block (which may be made of a conductive material such as aluminum) including two halves 522 and 524. One side has a hole 526 to fit a heater cartridge. The halves are held together using bolts in holes 528. The heater is machined such that it fits both around a standard NW cross and around a standard NW tee. The two halves are in intimate contact, so that the heat from the single cartridge spreads over both halves. A screw to mount a temperature sensor is also provided on the heater block.

Figure 17:
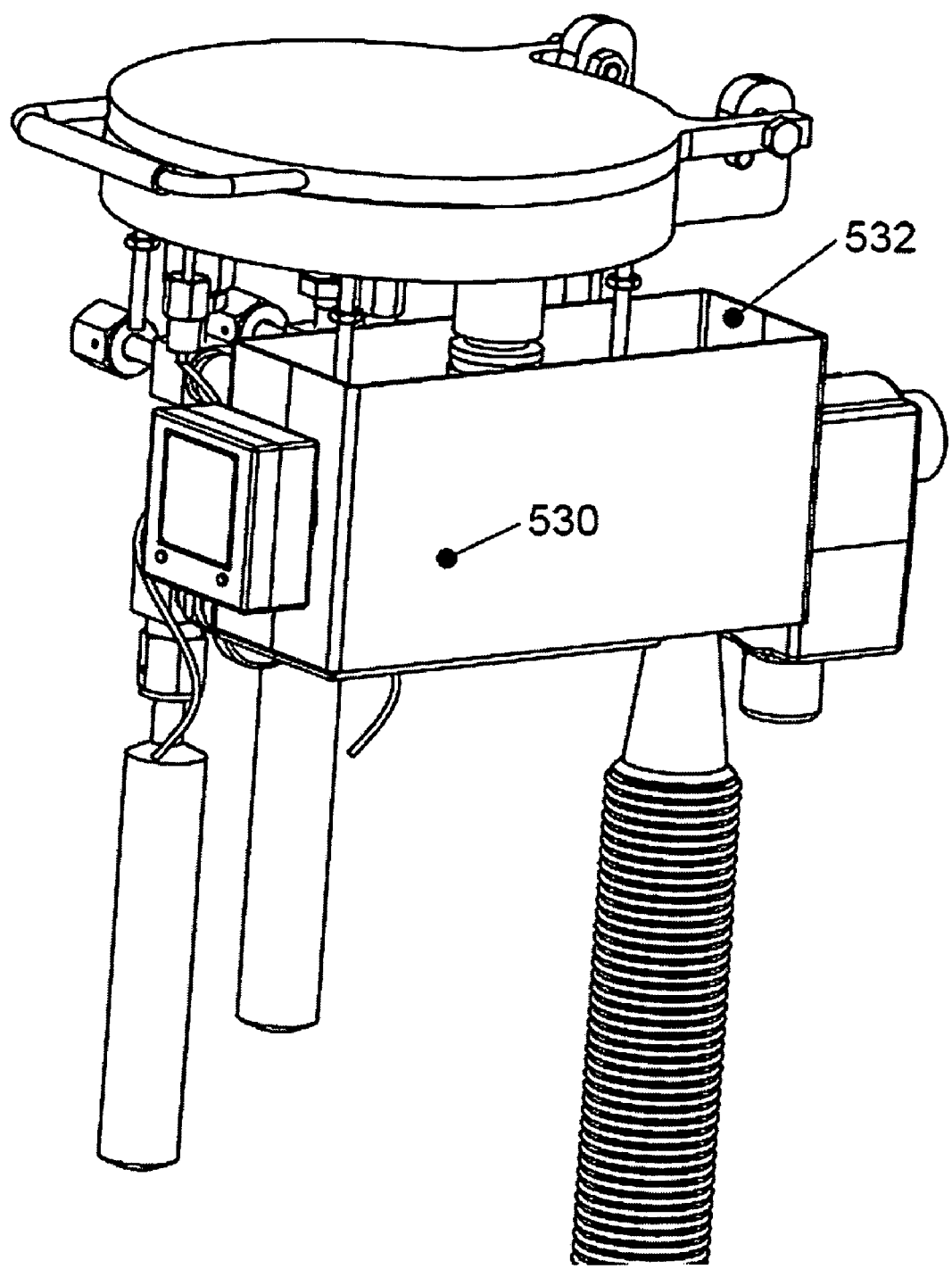
FIG. 17 shows the attachment of two reflector plates in a pumping line section according to an embodiment of the invention.

FIG. 17 shows reflector halves 530 and 532 which fit around the heater 524, a non-electronic part of gauge 312, and a non-electronic part of valve 206. The two halves may be held together by magnets, glued to the edges of each half. This allows easy mounting of these reflector plates. The reflector plates serve the purpose of both reflecting heat back into the to be heated parts, and keeping heat out from the electronic parts and further components in the cabinet.

Figure 18:
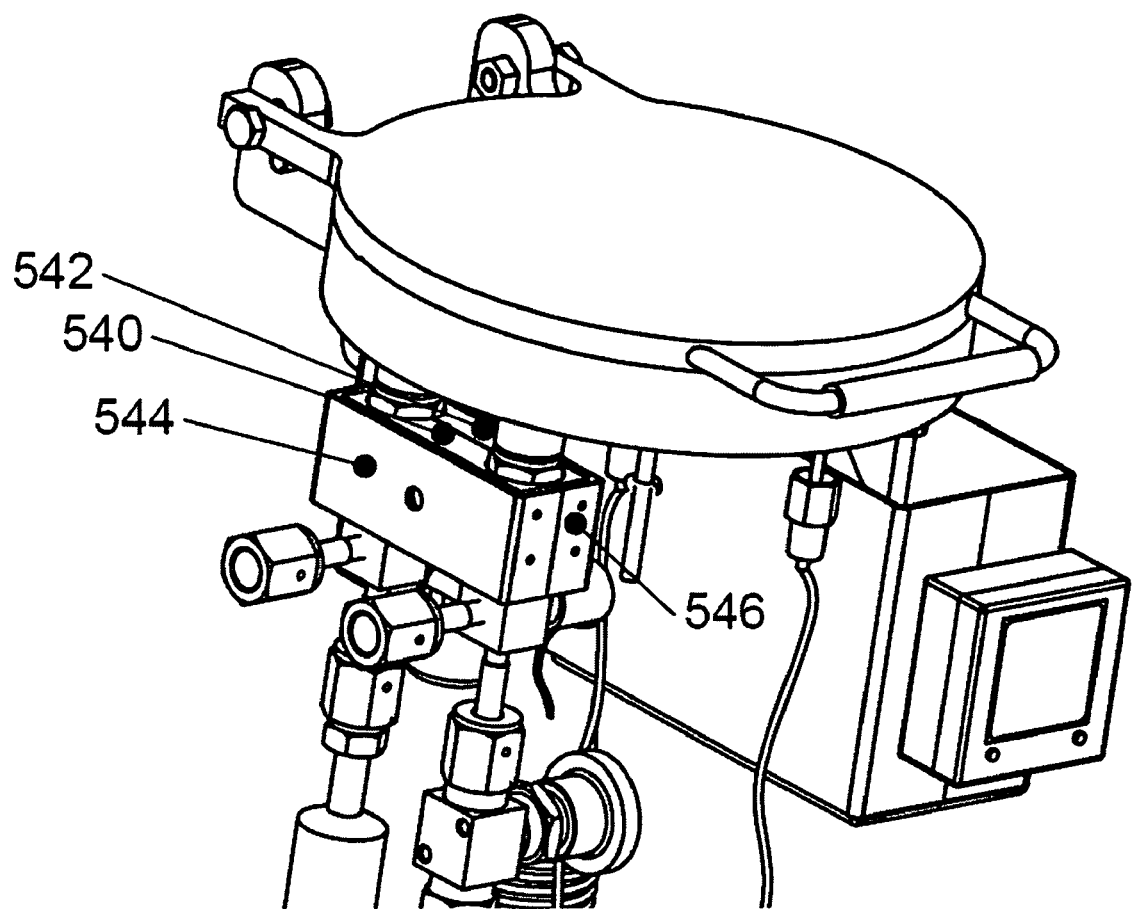
FIG. 18 shows a precursor line and pulse valve heating assembly according to an embodiment of the invention.

FIG. 18 shows the heater block for the two precursor input port configuration. Here two aluminum halves 540 and 542 clamp around the VCR fittings. A hole in one half of the aluminum block is provided to fit a heater cartridge. Metal reflector plates 544 and 546 are spaced (e.g., about ¼ inch) from the aluminum heater blocks, and keep the heat in the aluminum heater blocks. The temperature sensor for the pulse valves may be screwed onto the valves themselves. Threads in the side of the pulse valves can be provided for this purpose.

Figure 19:
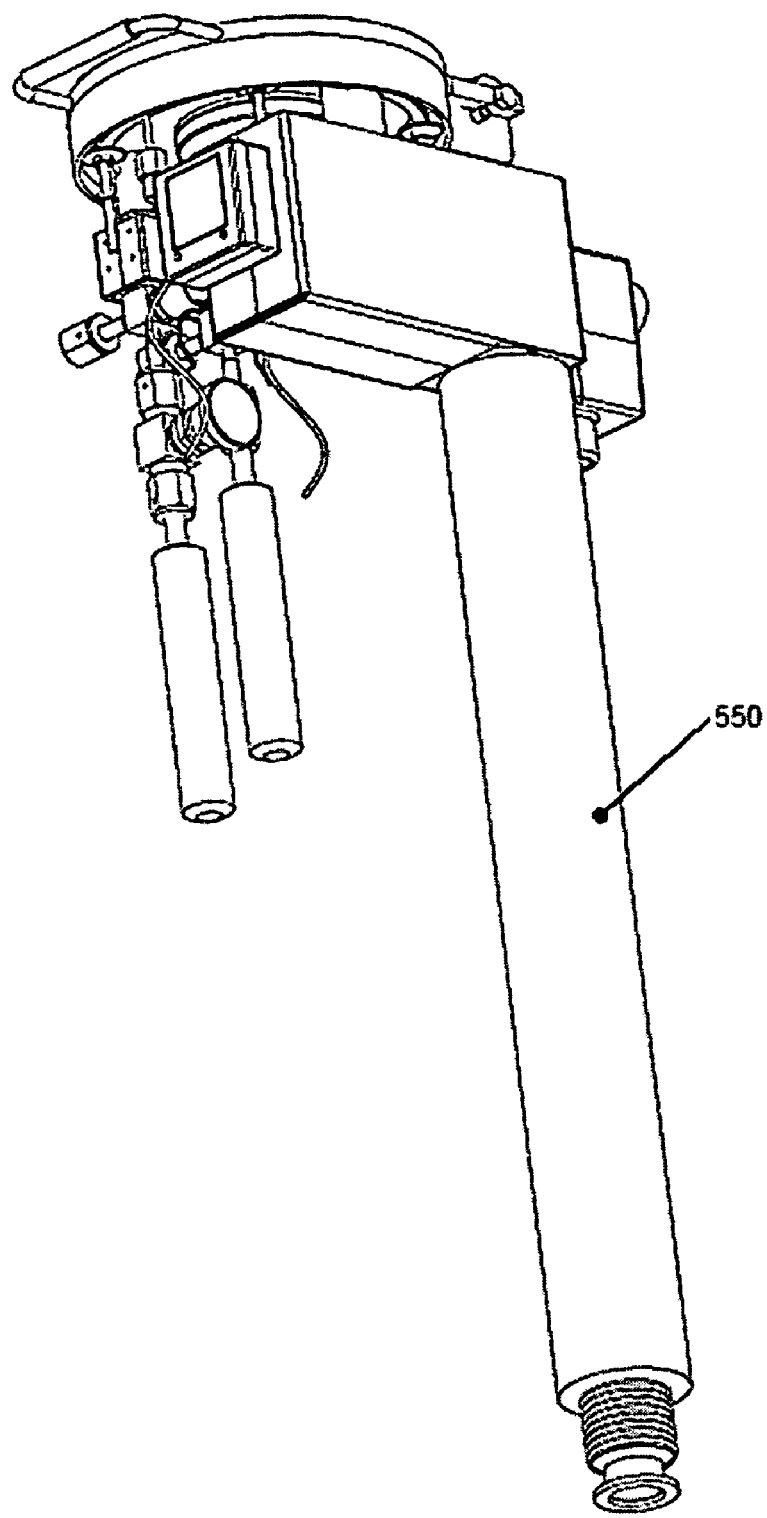
FIG. 19 shows a pumping line heating jacket according to an embodiment of the invention.

FIG. 19 shows a standard flexible heater jacket 550 that may be used to heat the pumping line bellows 304. It should be understood that similar heater jackets may also be used to heat the precursor supply lines and valve assemblies.

Figure 20:
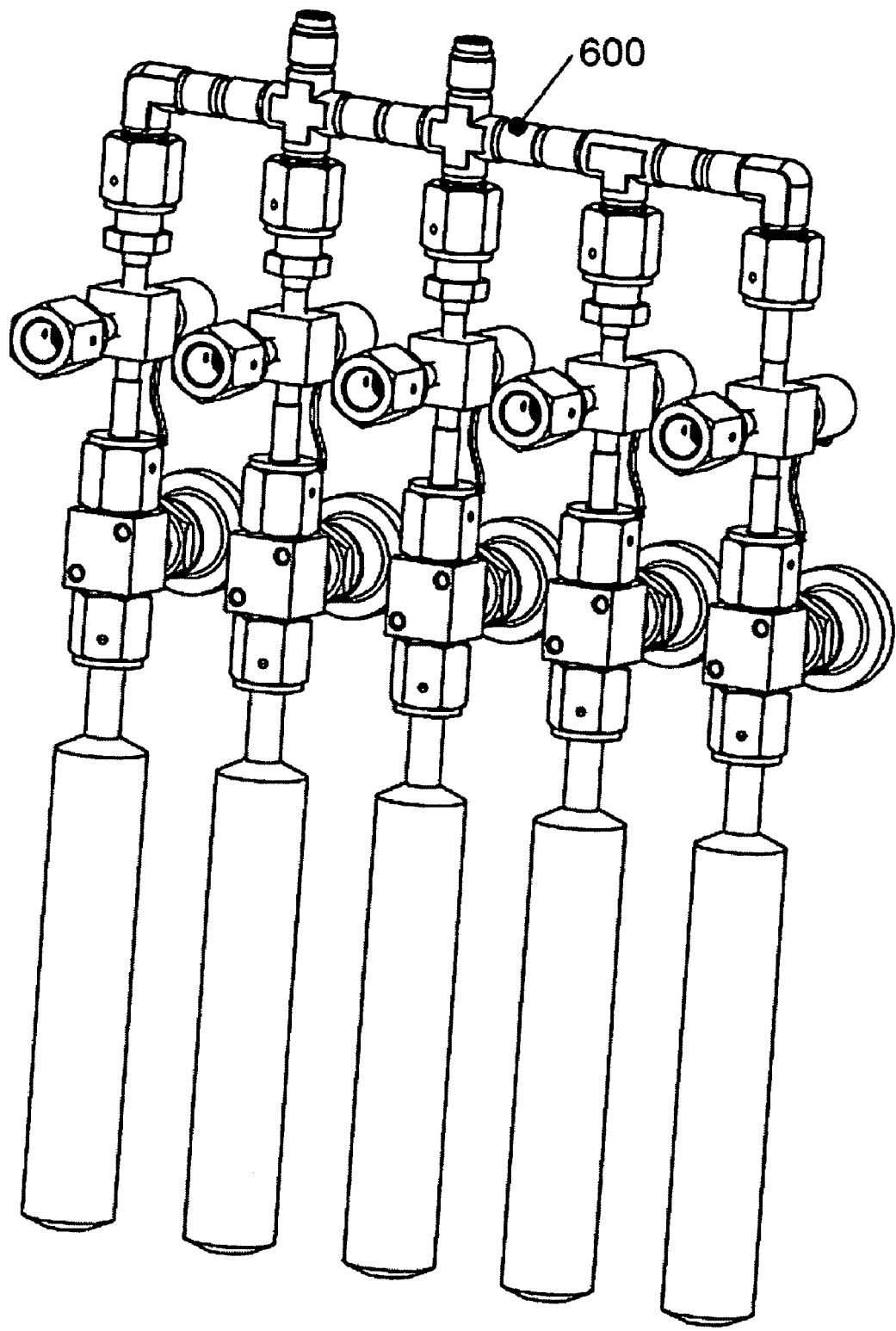
FIG. 20 shows a manifold for expanding the number of precursor lines according to an embodiment of the invention.

In FIG. 20, a multi-precursor manifold 600 is depicted. As shown, the manifold includes a number of inlets from respective precursor supplies. It should be understood that any suitable number of precursor supplies (e.g., 2, 3, 4, 5, etc.) may be used in connection with the manifold. Welded VCR pieces may be used to allow expansion of the number of precursors from two to the desired number (e.g., 3, 4, 5). In this embodiment, the manifold includes two outlets which are respectively connected to a first precursor supply and a second precursor supply. However, in other embodiments, the manifold may include a single outlet which may be connected to a single precursor port.

Figure 21:
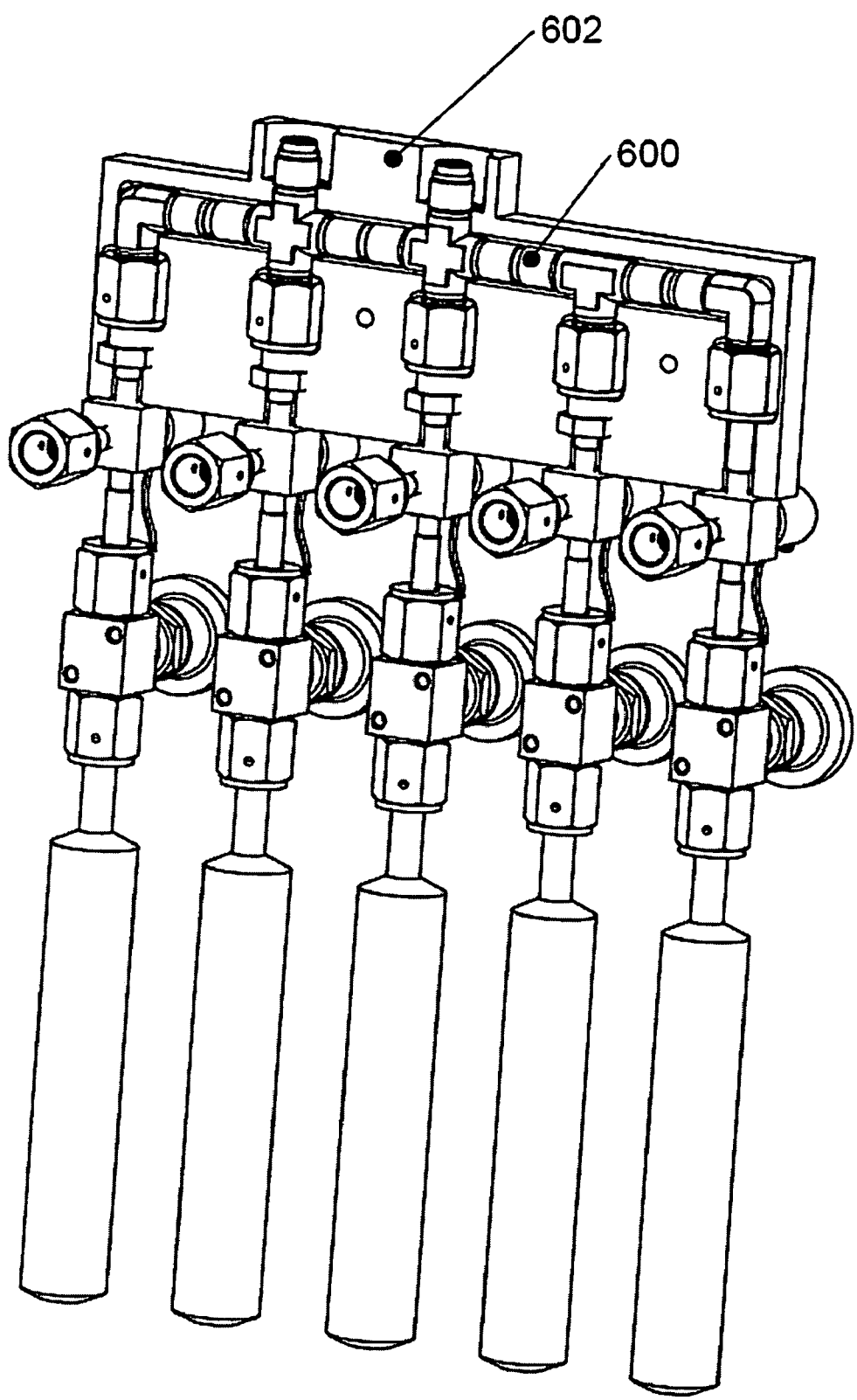
FIG. 21 shows one half of a manifold heater block according to an embodiment of the invention.
Figure 22:
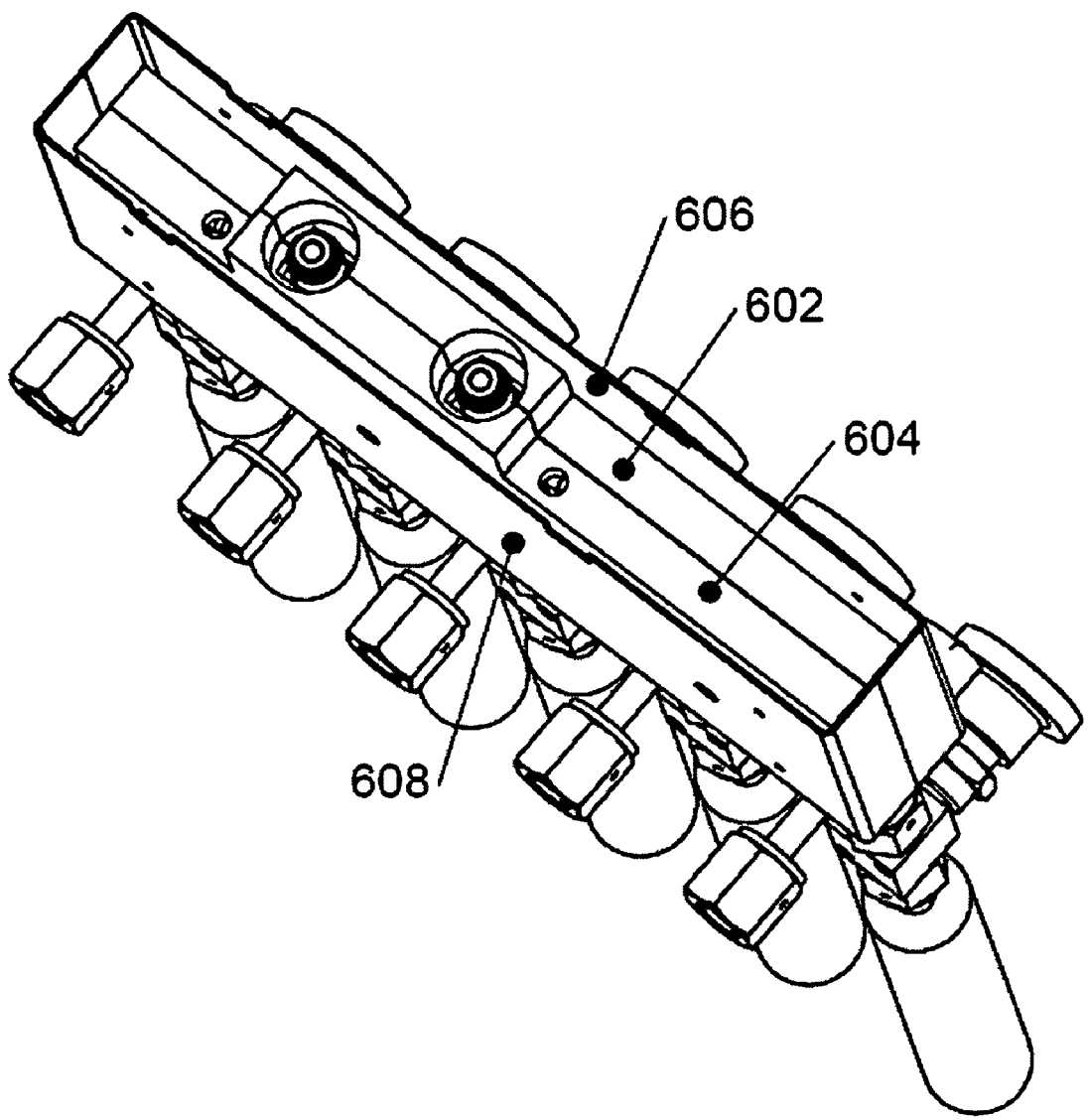
FIG. 22 shows a manifold heater block assembly according to an embodiment of the invention.

In certain embodiments, it may be preferred to heat manifold 600. FIG. 21 shows a heater associated with the manifold. A heater block half 602 is shown. The heater block may be made from a conductive material such as aluminum. This heater block has grooves machined, to allow fitting of the manifold and VCR connections. FIG. 22 shows a top view of the manifold heater assembly 600. Here, halves 602 and 604 are shown in intimate contact. Sheet metal reflector plates 606 and 608 are again used to keep the heat inside.

An RTD temperature sensor 136 is shown in FIG. 7A. The sensor measures the temperature of the reactor base wall, but because of the close proximity of its sensitive tip to the O-ring and direct mechanical contact between the lid and the reactor base section, the sensor may allow for indication of wall, O-ring and top lid temperature. In embodiments when the lid is made of high thermal conductivity material (such as aluminum), the lid temperature may be in thermal equilibrium with the wall temperature, and evenly distribute the heat from tubular wall heater 126. Such a construction may be preferred in certain embodiments.

Figure 9:
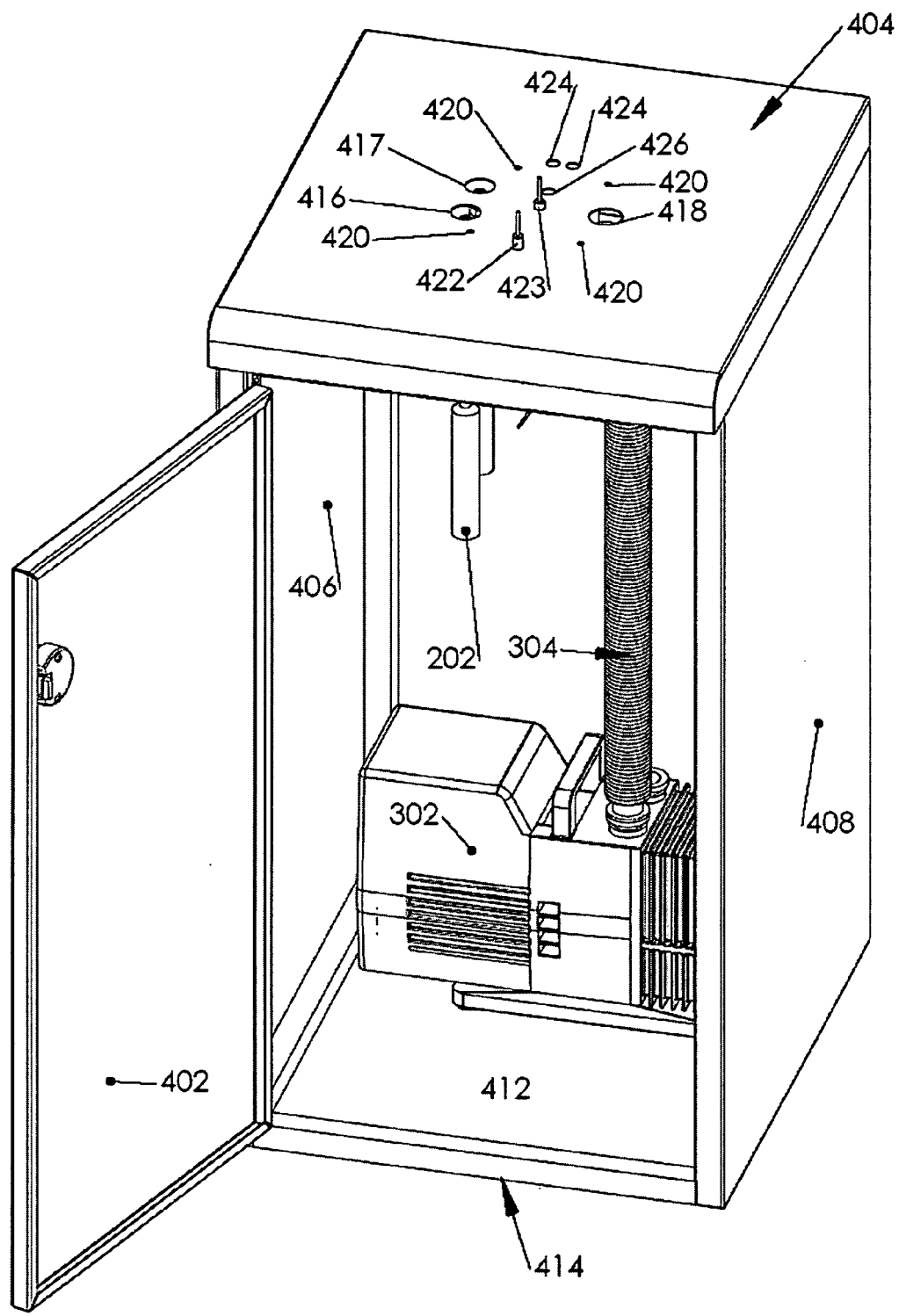
FIG. 9 is an isometric view of the a cabinet with precursor line assembly, pumping line assembly, pump (partial view), RTD (resistor temperature detector) temperature sensors and reactor feed through and fixing holes according to an embodiment of the present invention.

FIGS. 8 and 9 show how the reactor base is connected to the cabinet top according to one embodiment of the invention. Tubular heater 126 is fixed to a semicircular cutout in the reactor bottom using four bolts 128. As shown, the same four bolts 128 are used to fix the reactor to the cabinet: bolts 128 match holes 420 and the height of the reactor above the cabinet can be adjusted by altering the position of the nut on bolt 128. A vertical separation between reactor 102 and cabinet top 404 provides insulation between reactor bottom and cabinet top and allows heat to be dissipated and not transferred to the inside of the cabinet, which advantageously can keep the pump and electronics inside cool. The holding bolts 128 may be made of a low thermal conductivity material (e.g., stainless steel) and have a relatively small cross section, to limit transfer of heat from the reactor to the cabinet.

RTD temperature sensors 422 and 423 are fixed to the cabinet. Upon removal of the reactor from the cabinet, for cleaning or other purposes, the RTDs slide from their matching holes 134 and 130. This facilitates disassembly of the system.

As shown in FIG. 8, heating of the reactor is controlled via substrate heater 124 and wall-lid tubular heater 126. As noted above, these heaters may be positioned on the outside of the reaction chamber. For example, substrate heater 124 is mounted outside of the reaction chamber, to avoid contamination inside the reaction space and prevent the need for electrical vacuum feedthroughs. In embodiments that include a thin reactor bottom made of a low thermal conductivity material (e.g., stainless steel), heat transfer is limited from the center of the chamber to the sidewalls and vice versa, permitting individual control of both sections. The thin reactor bottom portion 140 between substrate heater and wall heater section is shown more clearly in the cross section of the reactor, FIG. 11B.

For reactors where the desired deposition temperature does not exceed the allowable reactor O-ring temperature, differential heating of the reactor using a separate substrate heater and tubular wall heater can be avoided, and one uniform heater can be mounted to the bottom of the reactor. In these embodiments, the bottom of the reactor can be thicker, and made of a higher thermal conductivity material, if so desired.

Figure 10:
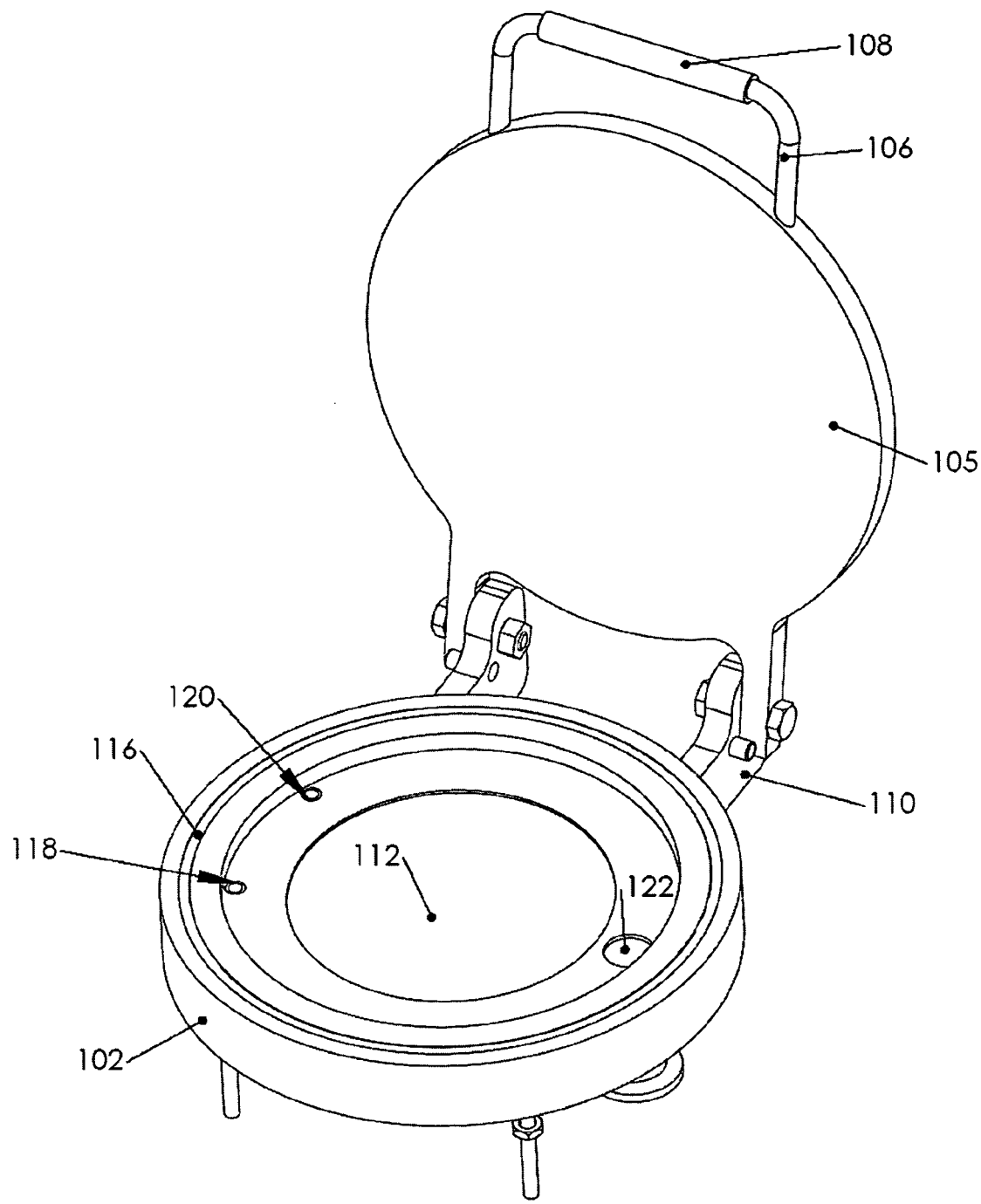
FIG. 10 is an isometric top view of an ALD reactor according to an embodiment of the present invention.
Figure 11B:
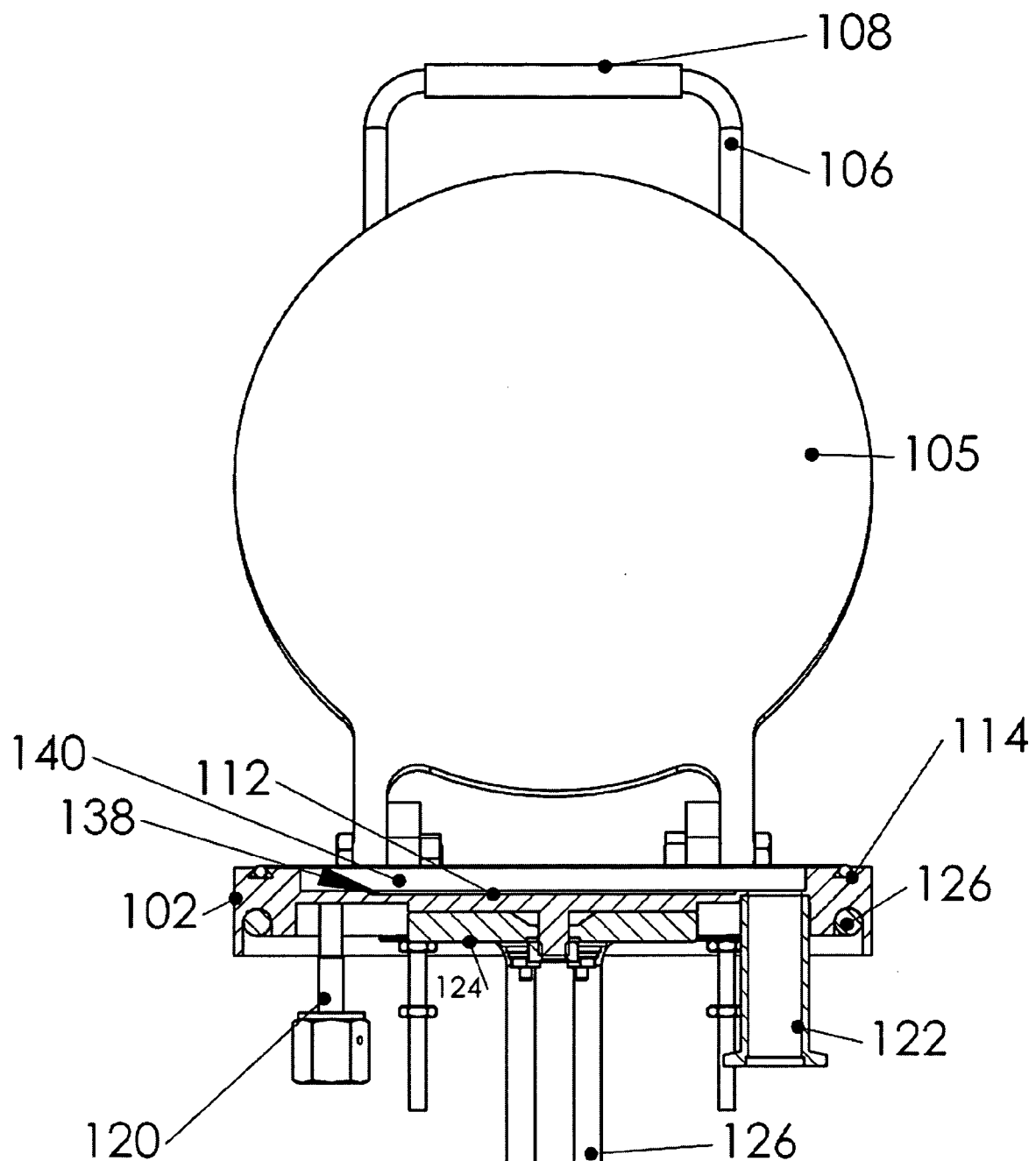
FIG. 11B is a cross section of the reactor at section line "C" of FIG. 11A, according to an embodiment of the present invention.
Figure 12A:
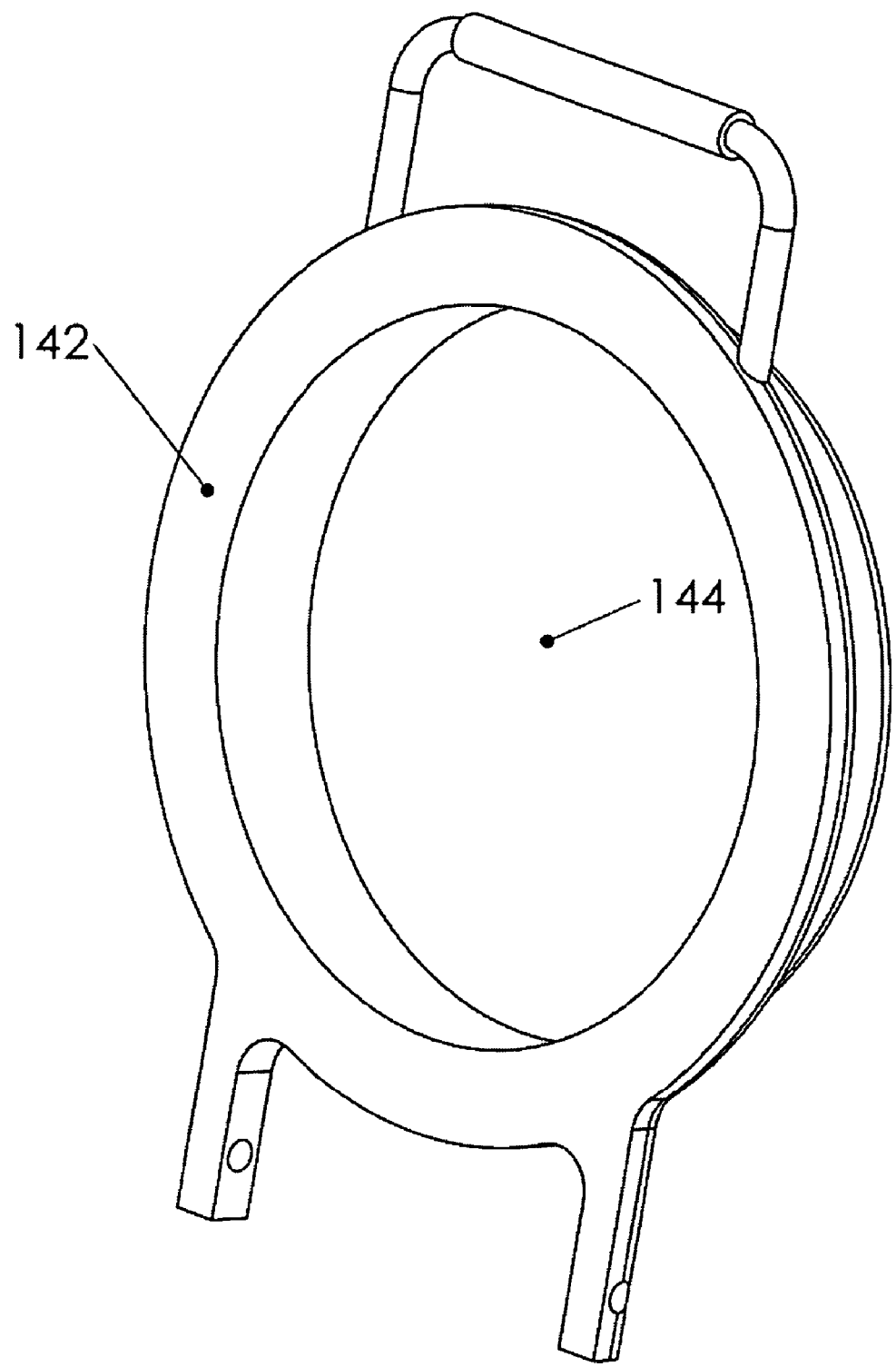
FIG. 12A is a top lid with expanded cavity for thicker substrates according to an embodiment of the present invention.
Figure 12B:
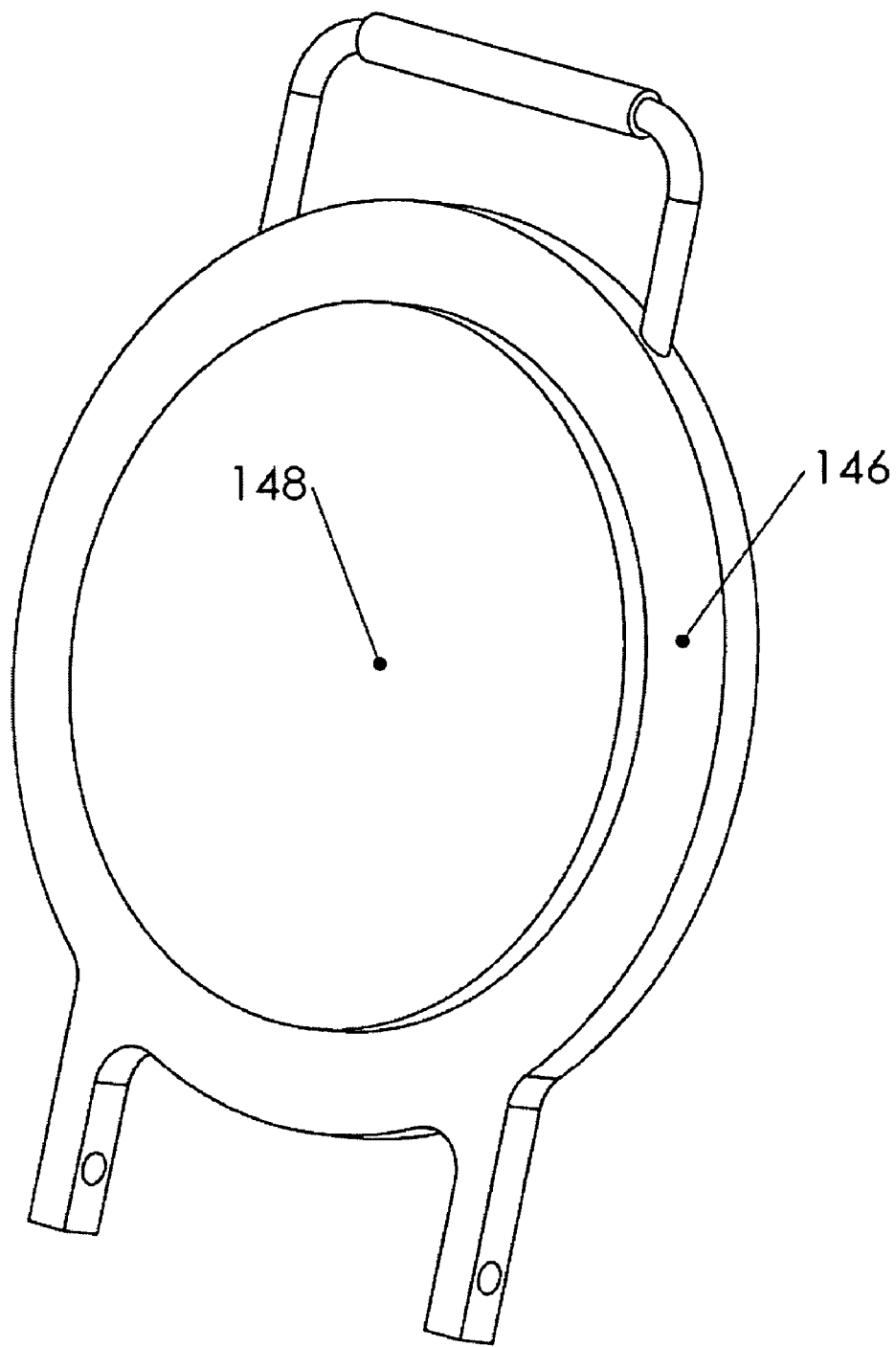
FIG. 12B is a top lid with protruding lid for thinner substrates or reduced precursor consumption or more uniform vapor flow according to an embodiment of the present invention.

FIGS. 10 and 11B show locations of the two precursor ports and the pumping line port (i.e., outlet port) in this embodiment. The substrate area is located in-between. In addition to the above-described advantages, because the precursor and outlet ports are located on the bottom and not on the side of reactor 102, the height of the reactor space 140 can be very small. Without complicating manufacture or assembly, this improves gas flow and allows low vapor doses. For very thick samples, the top lid can be easily replaced by a lid 142 with a vertically ascending cavity 144, as shown in FIG. 12A. If desired, the reaction chamber can also be decreased in volume, by using a lid with a surface protruding into the reaction chamber (FIG. 12B).

Figure 13:
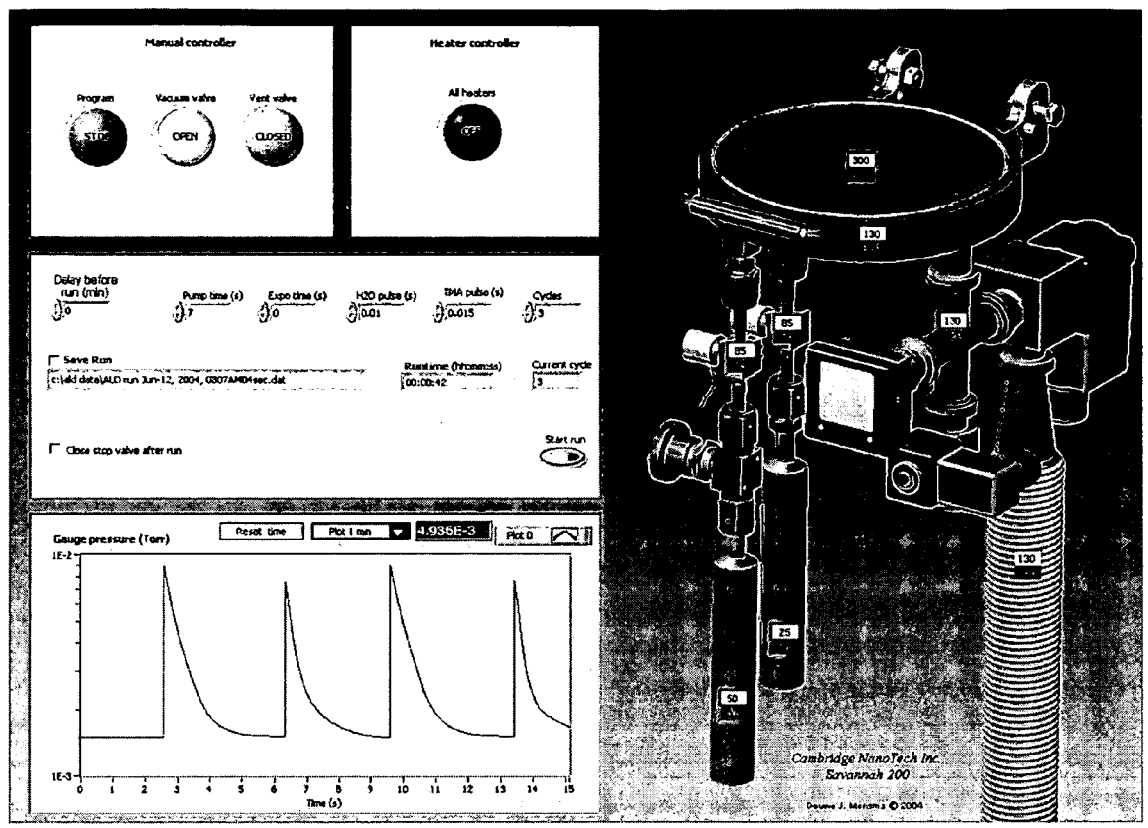
FIG. 13 is a screenshot of the control software programmed in "Labview", used in an embodiment of the invention to control an ALD system.

FIG. 13 shows a screenshot of the control software during a deposition run. As can be seen, the substrate temperature (300° C.) is controlled independently from the wall-lid temperature (130° C.). Separate pressure pulses are observed in mode 1 ALD operation, as described further below.

Figure 14:
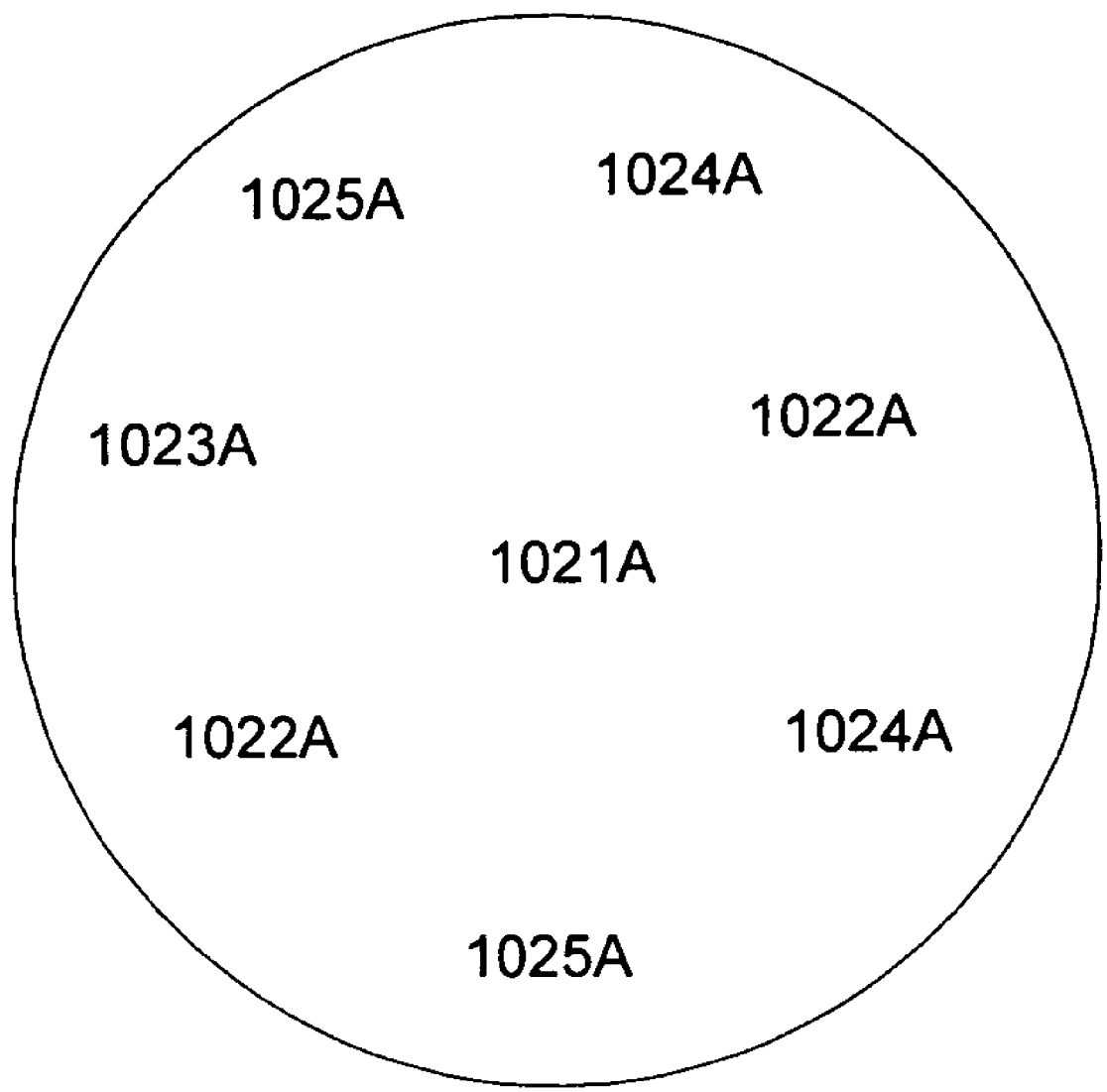
FIG. 14 shows the results of the thickness distribution in Angstroms, of an exemplary $Al_2O_3$ atomic layer deposition run on a 4-inch silicon wafer according to a method of the invention, as measured with an ellipsometer.

FIG. 14 shows the thickness results of a run with TMA and water precursors after a 900 cycle run on a 4-inch wafer using an ALD system and method of the present invention. The thickness is measured with an ellipsometer and the variation across a four inch wafer is less than 1%. Although the example shown in FIG. 14 is for a 4-inch wafer, it should be understood that the present invention can be used for a wide variety of samples including wafers of any suitable dimension, or non-wafer substrates.

Certain embodiments of the invention may use a programmable logic controller (PLC), which by definition contains an on board processor for autonomous process control. However, in some embodiments, accurate timing between valve pulses and accurate start and end of a process run, only the valve pulse time itself needs to be controlled beyond direct PC control capabilities: the pump/purge time between pulses is of the order of several seconds and falls well within the realm of direct USB PC control of a logics card with solid state relays, which is typically around 20 milliseconds. The valve pulse time usually has to be anywhere around 1-100 milliseconds, and needs to be controlled accurately. A simple pulse time code provision on a non-autonomous control card can be sufficient in certain embodiments of the invention and can satisfy this requirement without the need to employ a PLC which can be expensive.

Figure 24:
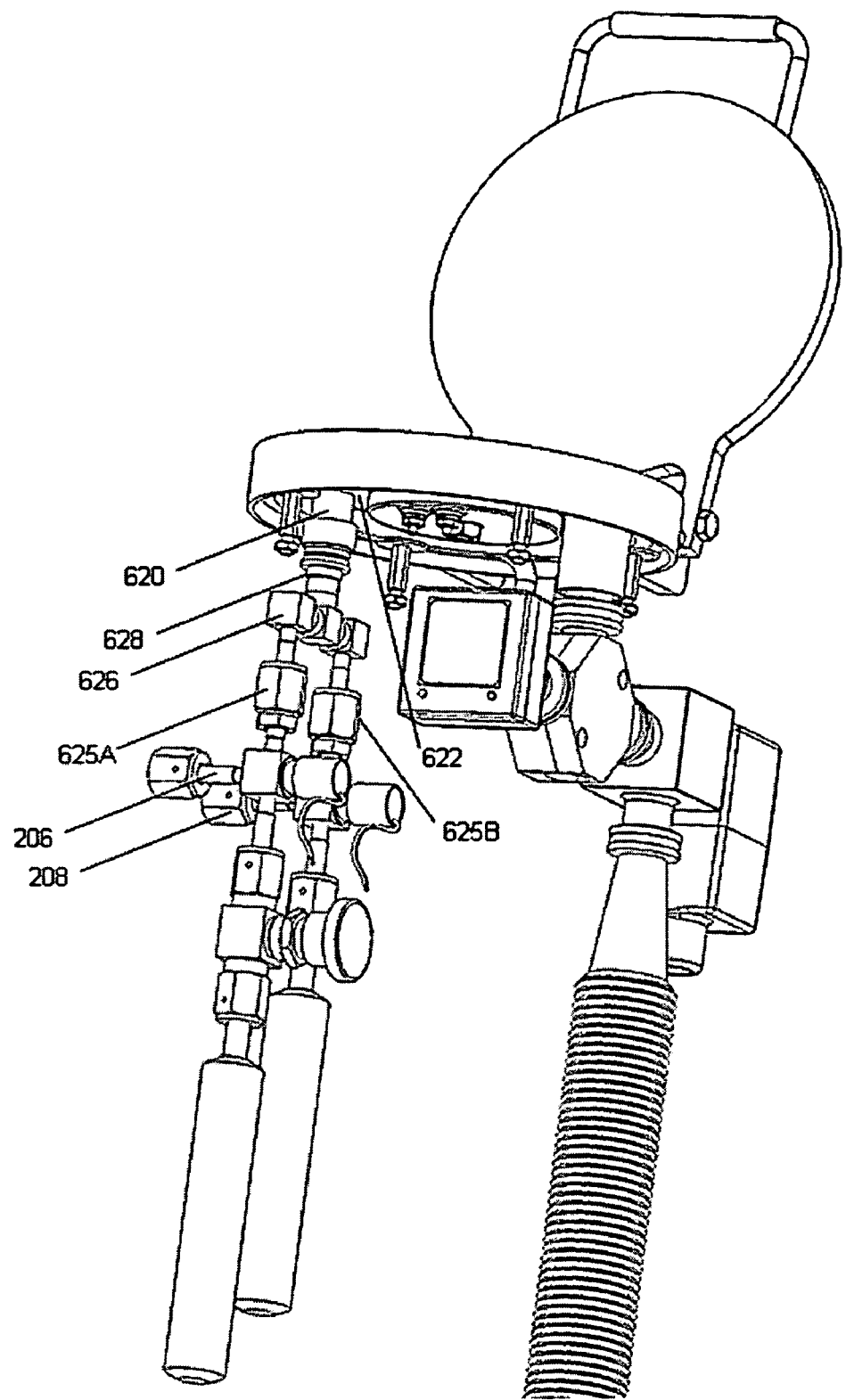
FIG. 24 is an isometric view of a reactor assembly that includes a single precursor port according to an embodiment of the present invention.
Figure 25:
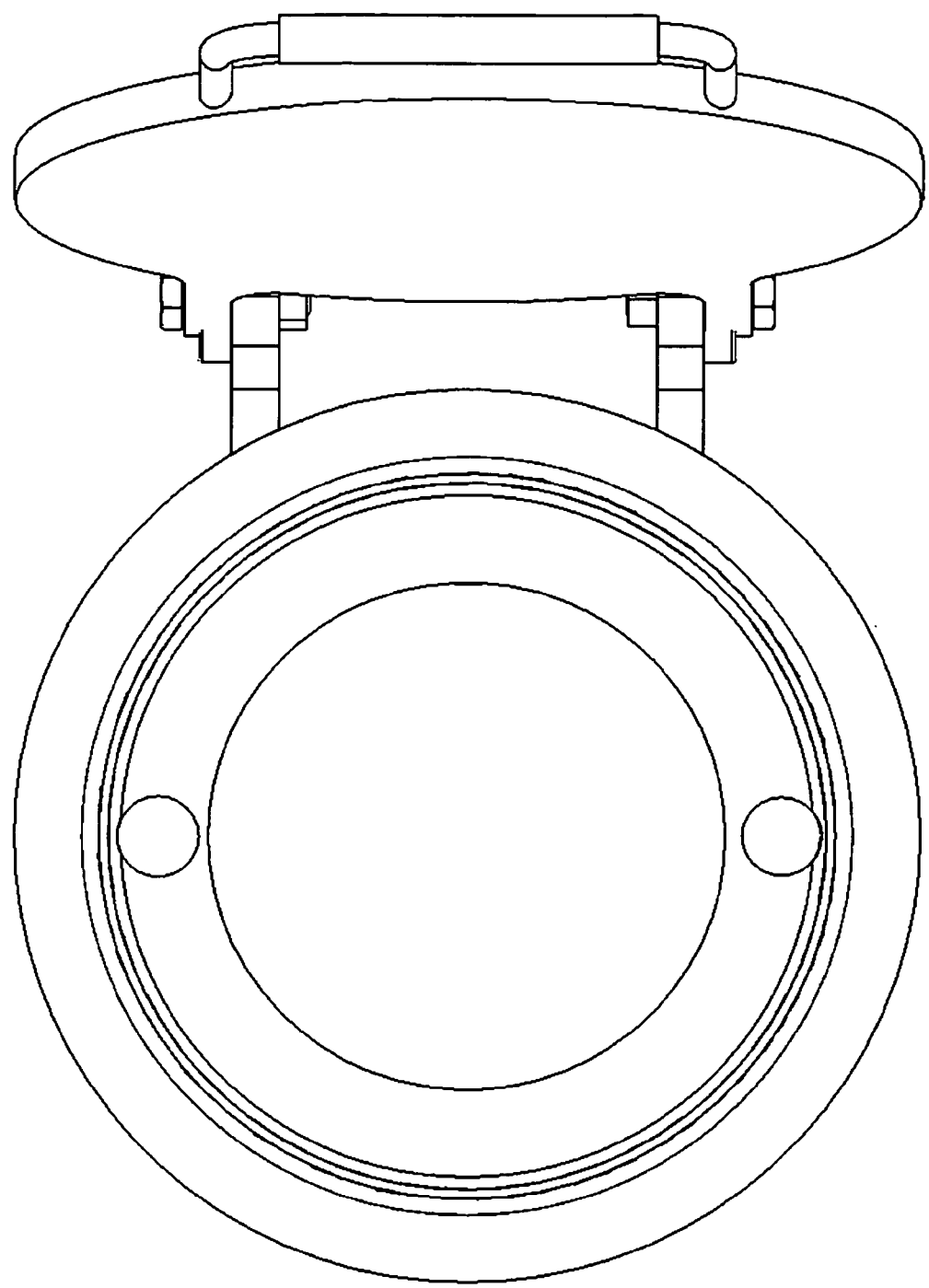
FIG. 25 is a top view of a reactor that includes a single precursor port according to an embodiment of the present invention.

FIGS. 24 and 25 illustrate components of a system that includes a single precursor port 620 formed in a bottom surface 622 of the reactor chamber according to an embodiment of the present invention. As shown, the single precursor port is positioned on an opposite side of the substrate from outlet port 624 (which may be connected to a vacuum). In certain embodiments, a single precursor port may be preferred. For example, in certain embodiments, a single precursor port can increase uniformity of precursor flow within the system.

In this illustrative embodiment, first precursor supply 16 and second precursor supply 18 are connected to respective inlets 625a, 625b of a manifold 626. It is also possible for additional precursor supplies to be connected to respective inlets of the manifold in other embodiments of the invention. The manifold includes a single outlet 628 connected to precursor port 620. As described above in connection with the two port embodiment, pulse valves 206, 208 may provide connection to inert gas supplies. The operation of the pulse valves is similar to that described above.

In certain embodiments of the invention, a trap material may be used to adsorb un-reacted precursor that is being removed from the reaction chamber (e.g., through the outlet pump). In particular, in ALD processes, such un-reacted precursor can deposit on system components (such as vacuum gauges, vacuum valves, vacuum lines, and even the vacuum pump) which can impair performance (e.g., concentration measurement by gauge) and may require cleaning.

Figure 26:
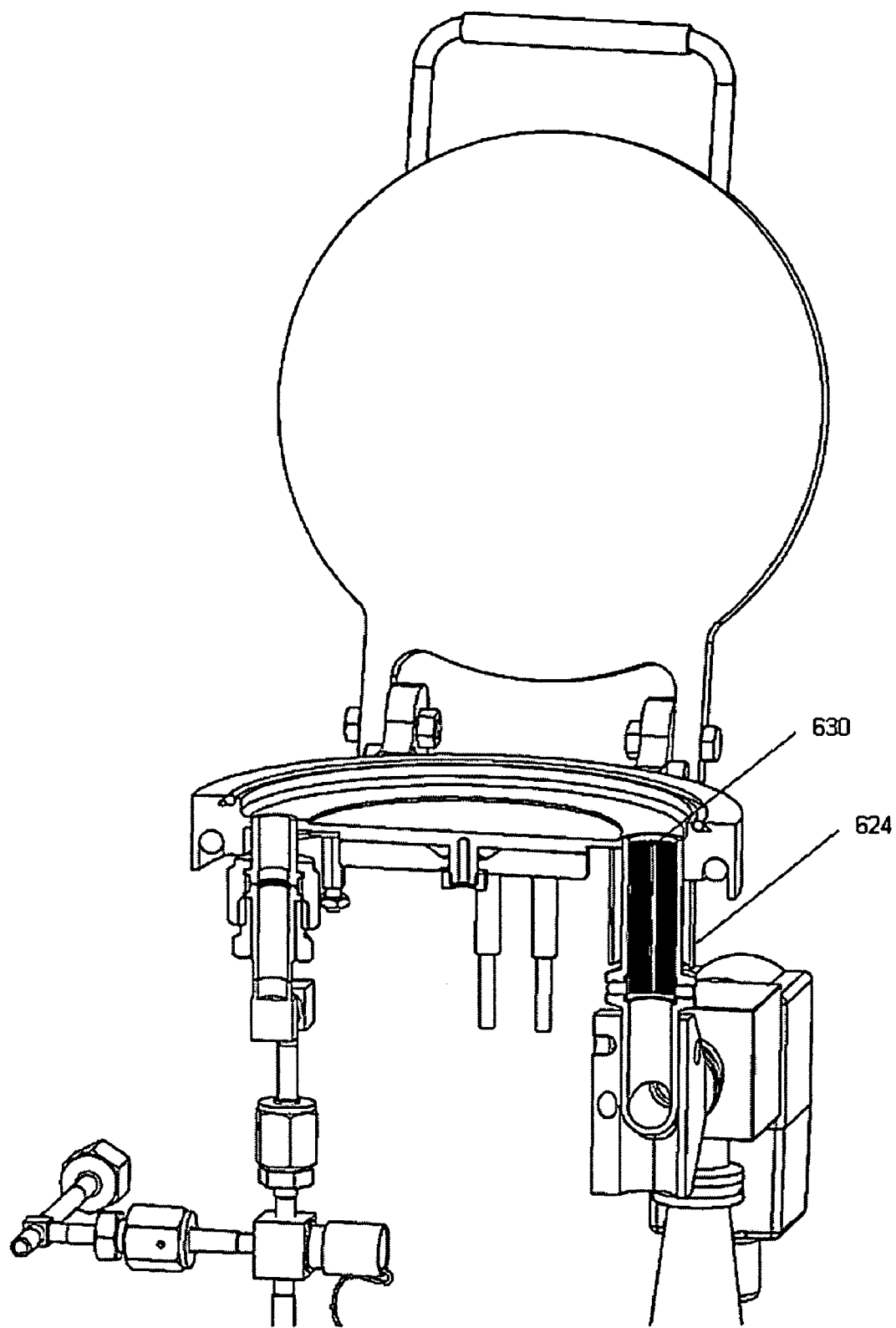
FIG. 26 is a section view of a reactor assembly that includes a trap material positioned in an outlet port according to an embodiment of the invention.

The trap material may be positioned in the precursor flow path between the reaction chamber and the vacuum gauge. In certain embodiments, it may be preferred for the trap material to be positioned (at least in part, and, in some cases, entirely) in the outlet port. FIG. 26 shows a trap 630 positioned in outlet port 624 according to one embodiment of the invention. Positioning the trap in the outlet port may be particularly preferred to facilitate trap replacement.

During operation, the trap typically is maintained at an elevated temperature. In some embodiments (e.g., when the trap is positioned, at least in part, in the outlet port), the trap is heated to a sufficient temperature by thermal conductance from the reaction chamber (which, for example, is heated by a tubular heater). Thus, in these embodiments, the trap does not need to have a separate heater.

In general, any suitable trap may be used, though certain trap designs may be preferred as described further below. Typical conventional trap examples include stainless wool, aluminum wool, copper wool, activated carbon and activated alumina, amongst others. Characteristics that can be desirable in trap materials include one or more of the following: (a) surface area sufficiently large not to let excess precursor pass therethrough, but sufficiently small (or free of pores that are too small) not to trap all chemicals and/or cause backdiffusion into the chamber (e.g., a surface area between 5 and 100 times the effective surface area upstream of the trap which includes (at least) the substrate surface area and the surface area inside the chamber); (b) small flow resistance; (c) allows the same deposition process to occur on the trap as it does on the substrate; (d) passes reaction products therethrough without trapping, to enable measurement of the reaction product (which is related to the original precursor amount, and related to the deposited film surface); (e) made of a material with a similar expansion coefficient as the deposited materials, particularly for ceramic coatings; (f) allows coating of many deposition runs without filling up; (g) manufacturable at low cost; and (h) does not create dust or break parts that can break the vacuum pump.

In some embodiments, it may be preferred for the majority of the surface area (e.g., greater than 50%, greater than 75%, greater than 95%, etc.) of the trap to be substantially parallel to the flow of gaseous species therethrough. In certain cases, substantially all (i.e., greater than 99%) of the surface area of the trap is parallel to the flow of gaseous species therethrough. This facilitates deposition of the precursor on trap surfaces, reduces flow resistance and can promote flow of reaction product therethrough. In some of these embodiments, the trap includes at least a portion having a corrugated surface. In some cases, the trap may include both a corrugated surface portion and a flat surface portion. The corrugated surface portion may be a separate component from a flat surface portion component and the two components may be assembled together; or, the corrugated surface portion and flat surface portion may be different portions of the same component.

In certain embodiments, the trap may be formed of material(s) that are non-porous.

Figure 27:
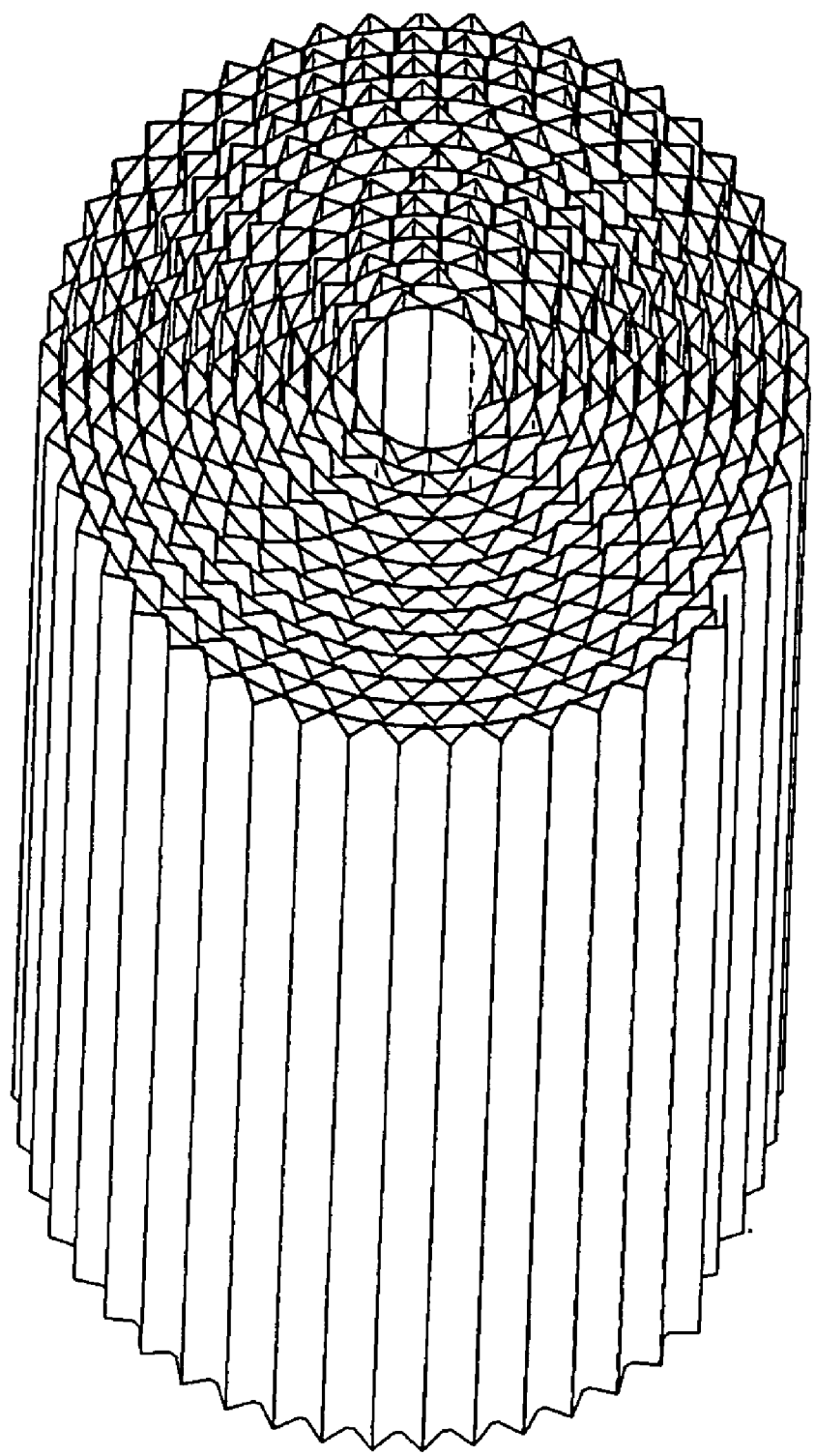
FIG. 27 shows a trap material according to an embodiment of the invention.

When the corrugated surface portion and the flat surface portion are separate components, the trap may be a coil assembly of a flat thin foil rolled together with a corrugated thin foil as shown in FIG. 27. The surface area of such a trap can be controlled by tuning the length, diameter and corrugation of the element. The flow resistance of such a trap can be very low because the metal foil surface is very smooth and not porous, nor does it have any substantial surface area or wires perpendicular to the flow. In addition, the open area percentage can be very large because the thickness of the metal foil can much smaller than the pore size (corrugation). Typically the thickness of the foil would be around 5-25 micrometer and the pore size 100-1000 micrometer. Typically, in atomic layer deposition processes, films grow on all surfaces, but since flow passes over the surface of this corrugated trap foil in much the same way it goes over the substrate, typical deposition characteristics will be the same. Because the trap foil has a smooth surface, volatile phase reaction products generally do not stick to the trap in much the same way these reaction products do not get incorporated into the film grown on the sample surface during ALD. Thus, the precursor can react on the surface of the trap, until it is depleted because the surface area is large, and pass through the volatile reaction product to the gauge for measurement, and then to the vacuum pump to remove from the chamber.

Since the foil can be made of virtually any metal, and the metals can be chosen for their thermal expansion coefficient to match the deposited coating, delamination and flaking of deposited coating from the trap during heating and cooling can be limited. For typically deposited ceramics, which have low flexibility themselves, expansion engineered metals can be used for the foil, such as kovar, invar and other expansion engineered alloys. For typical processes that deposit $Al_2O_3$, molybdenum can be effectively used as a foil material, since it is unreactive, strong, and has a thermal expansion coefficient similar to that of $Al_2O_3$. The pore sizes of the illustrated trap are typically of the order of 100-1000 micrometers, allowing deposition of at least half that amount. Typically deposited coatings in one ALD run are of the order of 10-100 nm, allowing almost 1000 runs before needing to replace or etch the trap material. Thin metal foils are low cost, readily available, and can be easily cut, stamped and rolled into the proper coil size. In contrast to ceramic materials and thin metal wires, which can form dust and particulates, the coiled foil is a stable shape when welded at the end and will not crack or break.

In some embodiments, the trap can be designed such that a user can visually observe precursor material deposited on the trap surface, during use, upon removal of the trap from the system. The precursor deposited on the trap was not deposited on the substrate in the ALD process and, therefore, is considered precursor "overdose". The user may determine by eye the distance the precursor has deposited on trap surfaces along the length of the trap. This distance is correlated to the overdose (e.g., greater distances represent larger overdoses). Traps having the majority of their surface area substantially parallel to the flow of gaseous species therethrough (e.g., as shown in FIG. 27) are particularly preferred in these embodiments. This "overdose" information may be used to adjust process parameters to ensure that the overdose is not too large or too small.

However, it should be understood that other trap materials known in the art may be used in certain embodiments of the invention.

It should be understood that depositions systems of the invention may have a variety of other designs not specifically shown, or described, herein. Variations would be known to those of ordinary skill in the art. For example, systems may include any combination of input and output ports (e.g., 5 input ports with one output port, 2 input ports with 2 output ports, etc). In addition to separate input ports, also input port manifolds can be used, where several input port assemblies, including cylinders and valves, are combined with manifold, the output of which is connected to the bottom of the reactor base. In addition to using two input ports on the reactor, it is also possible to use just one input port, and use a manifold to expand to 2, 3, 4, 5, etc. precursor lines.

Not excluding other modes of operation, such as for example multilayer and nanolaminate deposition, for illustration purposes, ALD operation can be grouped into four deposition modes: 1. pulsing precursors while continuously pumping, 2. continuously flowing inert gas while pulsing (adding) precursor and pumping continuously; 3. pulsing precursor with a stop valve closed and pumping in-between pulses; 4. pulsing precursors and purging/pumping with inert gas. In this mode, a stop-valve is a valve that isolates the pump from the reaction chamber and allows the precursor to remain in the reaction chamber until reacted or removed when opening the stop valve. The stop valve is also called a pumping valve or vacuum valve.

Figure 2A:
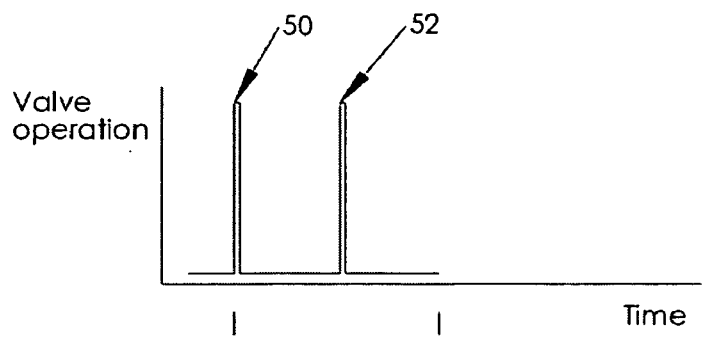
FIG. 2A is a typical timing diagram for an ALD valve pulsing process.
Figure 2B:
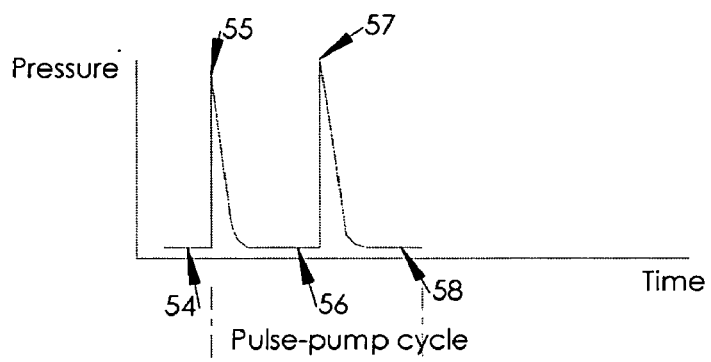
FIG. 2B is a typical timing diagram for an ALD gas pulsing-pumping process.

FIG. 2A shows a deposition cycle with two precursor valve pulses 50 and 52. Pulse width is typically 5 milliseconds, and usually shorter than the pump time between the pulses. FIG. 2B shows the first mode of operation in a pressure-time schematical sketch. While pumping continuously on a chamber, precursor 1 is pulsed, giving peak pressure 55, followed by a period of evacuation. The second precursor pulse gives a second pressure rise 57, followed by a second evacuation. This sequence is repeated until the desired film thickness is achieved. The valves, for example, may be solenoid valves such as parker 99 series valves or pneumatic valves such as Swagelok ALD valves.

Figure 2C:
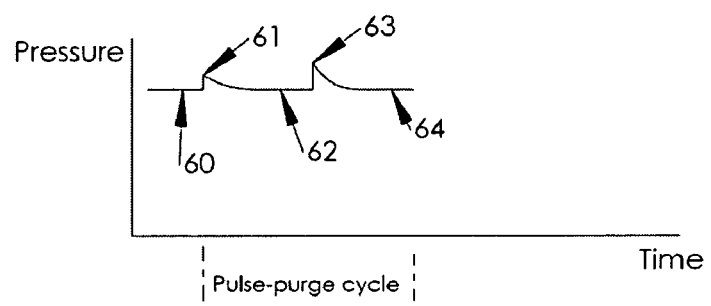
FIG. 2C is a typical timing diagram for an ALD gas pulsing-purging process.

FIG. 2C shows the second mode of operation in a pressure-time schematical sketch. While pumping continuously on a chamber while flowing an inert carrier gas such as nitrogen, base pressure 60 is generated in the substrate chamber. When precursor 1 is pulsed, pressure 61 is generated, consisting of inert gas pressure+precursor partial pressure. This pulse is followed by a period of inert gas flow and its corresponding pressure 62. The second precursor pulse gives a second pressure rise 63, followed by a second inert gas purge 64. This sequence is repeated until the desired film thickness is achieved.

Figure 2D:
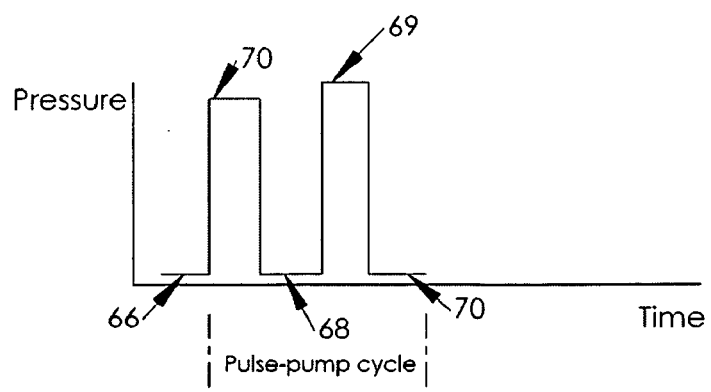
FIG. 2D is a typical timing diagram for a stop valve assisted ALD gas pulsing-pumping process.
Figure 3:
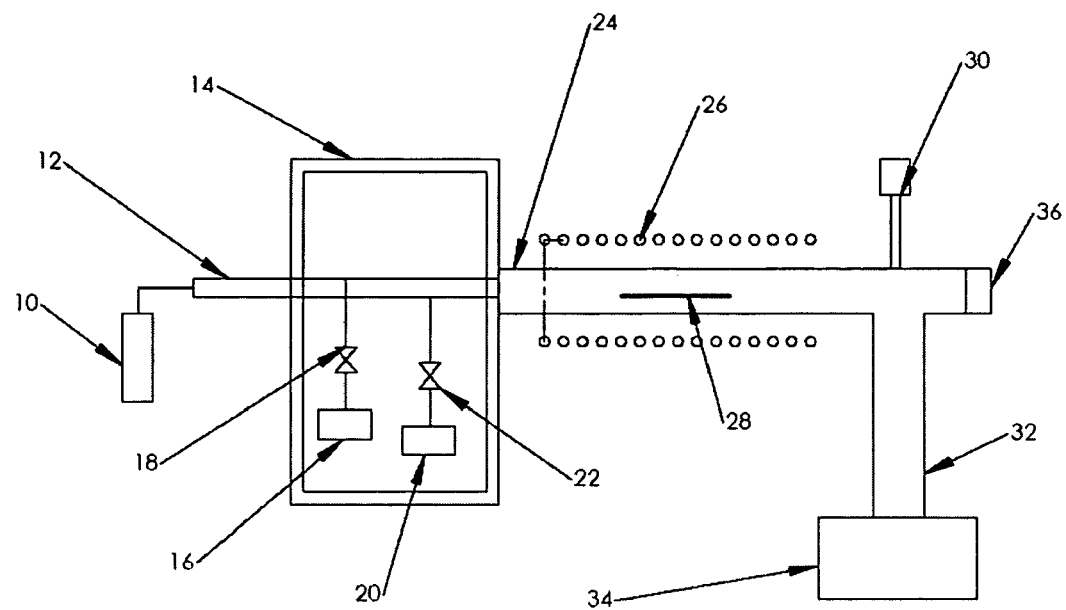
FIG. 3 is an example of an ALD tube furnace reactor system with horizontal laminar gas flow.
Figure 4:
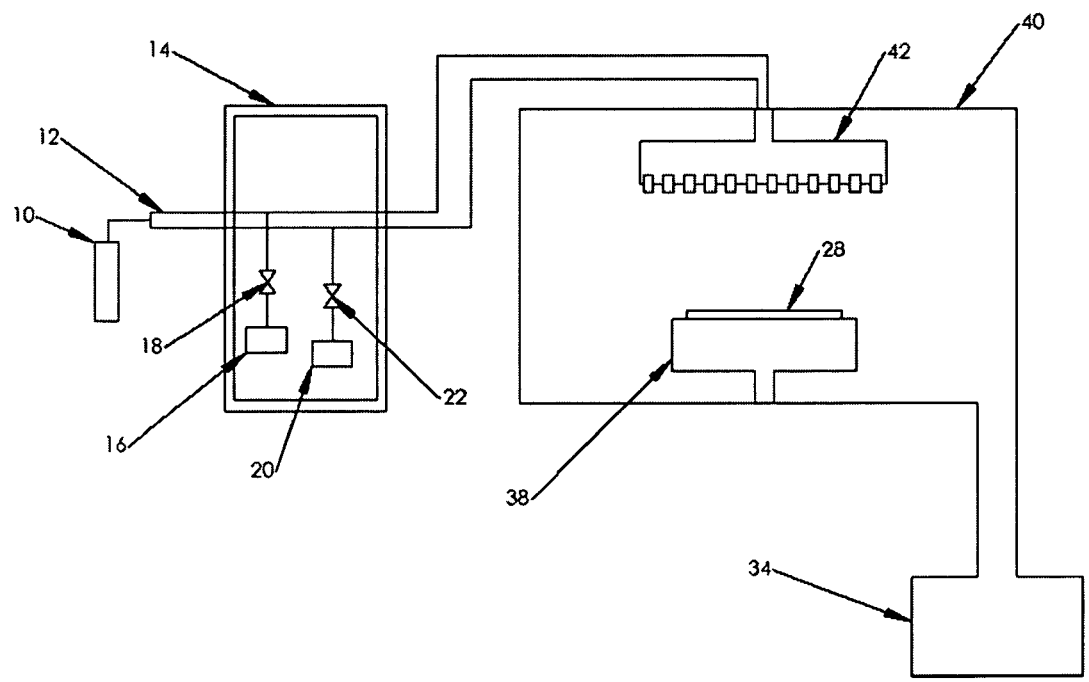
FIG. 4 is an example of an ALD deposition system with shower head gas injection.

FIG. 2D shows the third mode of operation in a pressure-time schematical sketch. After pumping continuously on a chamber during time 66, the stop-valve is closed. After this, precursor 1 is pulsed, giving peak pressure 70. After time-pressure 70, the stop valve is opened and the unreacted precursor portion is removed and the chamber evacuated, giving low pressure 68. This is followed by closing the stop valve and pulsing the second precursor, giving time-pressure 69. This is again followed by opening of the stop-valve and evacuating the reaction chamber, giving low pressure 70. Because of its self-limiting nature, the thickness is largely independent of flow. The consequence is an unequaled conformality over 3 dimensional structures such as trenches and wires.

A wide variety of materials (and combinations of materials) may be deposited on a wide variety of different substrates using the systems and methods of the invention. Such coated substrates may be used in a number of different applications. One application includes scratch resistant color coatings formed on substrates such as metals, plastics and glass. The coatings may be formed of, for example, $TiO_2$, $Zr_3N_4$, Cu, etc. Nanolaminates, consisting of different materials stacked on top of each other, with different refractive indices, may enhance this scratch resistance. ALD is particularly attractive for scratch resistant color coatings because the ALD technique allows deposition on complex 3D geometries and at low temperatures.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. An atomic layer deposition process comprising:
   positioning a substrate in a reaction chamber having a top surface, a bottom surface and a sidewall between the top and bottom surfaces;
   introducing a first precursor into the reaction chamber through a precursor port formed in the bottom surface, wherein a precursor layer of the first precursor is deposited on the substrate;
   removing gaseous species through an outlet port formed in the bottom surface;
   introducing a second precursor in to the reaction chamber through a precursor port formed in the bottom surface, wherein the precursor layer and the second precursor react to form a material layer on the substrate;
   removing gaseous species through the outlet port formed in the bottom surface,
   continuously introducing an inert gas into the reaction chamber during the steps of introducing the first precursor, removing gaseous species, introducing the second precursor and removing gaseous species; and
   reacting gaseous species removed through the outlet port on a surface area of a trap material positioned, at least in part, in the outlet port maintaining said trap material at an elevated temperature by thermal conduction from the reaction chamber without using a separate heater to heat said trap material, wherein the first precursor, the second precursor and the inert gas are introduced through the same precursor port which flow up out of the precursor port outlet on one side of the substrate, flow over an upper surface of the substrate to form the material layer on the substrate and then flow down into the outlet port, wherein gaseous species are continuously removed from the reaction chamber during the process, wherein a majority of the surface area of the trap material is substantially parallel to flow of gaseous species through the trap, and wherein the trap material is formed from a coiled corrugated non-porous metal foil element having a smooth surface.

2. The process of claim 1, wherein introducing the first precursor comprises pulsing the first precursor and introducing the second precursor comprises pulsing the second precursor.

3. The process of claim 2, wherein the layer of the first precursor is deposited on the substrate by pulsing the first precursor and a layer of the second precursor is deposited on the layer of the first precursor by pulsing the second precursor, the first precursor and the second precursor reacting to form a layer comprising a compound.

4. The process of claim 2, further comprising repeating the steps of pulsing the first precursor and pulsing the second precursor.

5. The process of claim 1, wherein the gaseous species includes unreacted precursor and reaction product.

6. The process of claim 1, further comprising observing by eye a precursor deposition distance along a length of the trap to determine information related to precursor overdose.

7. The process of claim 1, further comprising introducing the first precursor into the reaction chamber directly from the precursor port formed in the bottom surface and introducing the second precursor into the reaction chamber directly from the precursor port formed in the bottom surface.

8. The process of claim 1, wherein a manifold including an outlet is connected to the precursor port and respective inlets of the manifold are connected to a first precursor supply and a second precursor supply.

9. The process of claim 8, further comprising heating the manifold.

10. The process of claim 8, wherein a first pulse valve is disposed between the first precursor supply and the manifold and a second pulse valve is disposed between the second precursor supply and the manifold.

11. The process of claim 10, wherein each pulse valve includes an inert gas input port.

12. The process of claim 11, wherein the pulse valves pass a continuous flow of inert gas to the precursor port while passing pulses of the first precursor and the second precursor to the precursor port.

13. The process of claim 10, wherein the pulse valves generate precursor pulses using open pulse times in the range of 1-100 msec.

14. The method of claim 8, wherein the wherein the manifold includes only a single outlet.

15. The process of claim 1, wherein substantially none of the trap material surface area is perpendicular to flow of gaseous species through the trap.

16. The process of claim 1, wherein the gaseous species includes unreacted precursor, inert gas and reaction product.

17. The method of claim 1, wherein the step of introducing the inert gas into the reaction chamber generates a substantially constant base pressure inside the reaction chamber.

18. The method of claim 1, wherein the step of introducing inert gas into the reaction chamber generates a substantially constant base pressure inside the reaction chamber, the step of introducing the first precursor into the reaction chamber generates a first pulse pressure comprising the sum of the base pressure and a partial pressure of the first precursor, and the step of introducing the second precursor into the reaction chamber generates a second pulse pressure comprising the sum of the base pressure and a partial pressure of the second precursor.

* * * * *